(12) United States Patent
Corisis et al.

(10) Patent No.: US 7,888,185 B2
(45) Date of Patent: Feb. 15, 2011

(54) SEMICONDUCTOR DEVICE ASSEMBLIES AND SYSTEMS INCLUDING AT LEAST ONE CONDUCTIVE PATHWAY EXTENDING AROUND A SIDE OF AT LEAST ONE SEMICONDUCTOR DEVICE

(75) Inventors: David J. Corisis, Nampa, ID (US); Chin Hui Chong, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 1128 days.

(21) Appl. No.: 11/506,144

(22) Filed: Aug. 17, 2006

(65) Prior Publication Data
US 2008/0122113 A1    May 29, 2008

(51) Int. Cl.
*H01L 21/00* (2006.01)
(52) U.S. Cl. .................. 438/123; 257/676; 257/670; 257/671; 257/672; 257/673; 257/782; 257/E23.039; 257/E23.06; 257/779; 257/780; 257/781; 257/783; 257/784; 257/E23.069; 257/E23.04; 257/E23.041; 257/E23.042; 257/E23.043; 257/E23.045; 257/E23.048
(58) Field of Classification Search .................. 438/123
See application file for complete search history.

(56) References Cited

U.S. PATENT DOCUMENTS

| | | | | |
|---|---|---|---|---|
| 4,437,235 A | * | 3/1984 | McIver | 29/840 |
| 4,996,587 A | * | 2/1991 | Hinrichsmeyer et al. | 257/676 |
| 5,138,438 A | * | 8/1992 | Masayuki et al. | 257/686 |
| 5,216,283 A | * | 6/1993 | Lin | 257/787 |
| 5,281,852 A | * | 1/1994 | Normington | 257/685 |
| 5,291,061 A | * | 3/1994 | Ball | 257/686 |
| 5,313,096 A | * | 5/1994 | Eide | 257/686 |
| 5,323,060 A | * | 6/1994 | Fogal et al. | 257/777 |
| 5,347,159 A |   | 9/1994 | Khandros et al. | |

(Continued)

FOREIGN PATENT DOCUMENTS

JP    2001077294 A    3/2001

(Continued)

OTHER PUBLICATIONS

Isaak, H., et al., "Development of flex stackable carriers," Electronic Components and Technology Conference, 2000 Proceedings, Las Vegas, NV, pp. 378-384, May 21, 2000-May 24, 2000.

*Primary Examiner*—Fernando L Toledo
*Assistant Examiner*—Ankush k Singal
(74) *Attorney, Agent, or Firm*—TraskBritt

(57) ABSTRACT

Semiconductor device assemblies and systems that include at least one semiconductor device assembly include two or more semiconductor devices stacked one over another. Conductive pathways that extend around at least one side of at least one of the semiconductor devices provide electrical communication between conductive elements of the semiconductor devices, and optionally, a substrate. The conductive pathways may include self-supporting conductive leads or conductive traces carried by a substrate. Methods for forming semiconductor device assemblies having more than one semiconductor device include bending or wrapping at least one conductive pathway around a side of at least one semiconductor device and providing electrical communication between semiconductor devices of the assembly through the conductive pathways.

22 Claims, 11 Drawing Sheets

U.S. PATENT DOCUMENTS

| | | | |
|---|---|---|---|
| 5,386,341 A | 1/1995 | Olson et al. | |
| 5,394,010 A * | 2/1995 | Tazawa et al. | 257/686 |
| 5,394,303 A * | 2/1995 | Yamaji | 361/749 |
| 5,432,378 A * | 7/1995 | Whitney et al. | 257/529 |
| 5,448,511 A * | 9/1995 | Paurus et al. | 365/52 |
| 5,455,740 A * | 10/1995 | Burns | 361/735 |
| 5,486,798 A * | 1/1996 | Veitschegger | 333/116 |
| 5,499,160 A * | 3/1996 | Burns | 361/706 |
| 5,552,910 A | 9/1996 | Okano | |
| 5,552,963 A * | 9/1996 | Burns | 361/735 |
| 5,571,754 A * | 11/1996 | Bertin et al. | 438/109 |
| 5,598,033 A | 1/1997 | Behlen et al. | |
| 5,646,446 A | 7/1997 | Nicewarner, Jr. et al. | |
| 5,776,797 A * | 7/1998 | Nicewarner et al. | 438/107 |
| 5,835,988 A * | 11/1998 | Ishii | 257/684 |
| 5,854,534 A * | 12/1998 | Beilin et al. | 257/691 |
| 5,898,220 A * | 4/1999 | Ball | 257/723 |
| 5,910,685 A * | 6/1999 | Watanabe et al. | 257/777 |
| 5,952,717 A * | 9/1999 | Taniguchi et al. | 257/734 |
| 5,960,539 A * | 10/1999 | Burns | 29/854 |
| 5,977,640 A | 11/1999 | Bertin et al. | |
| 5,982,030 A | 11/1999 | MacIntrye | |
| 6,002,167 A * | 12/1999 | Hatano et al. | 257/696 |
| 6,013,948 A | 1/2000 | Akram et al. | |
| 6,014,316 A * | 1/2000 | Eide | 361/735 |
| 6,020,629 A | 2/2000 | Farnworth et al. | |
| 6,028,352 A * | 2/2000 | Eide | 257/686 |
| 6,028,365 A | 2/2000 | Akram et al. | |
| 6,049,123 A * | 4/2000 | Burns | 257/686 |
| 6,072,233 A | 6/2000 | Corisis et al. | |
| 6,137,163 A * | 10/2000 | Kim et al. | 257/686 |
| 6,153,929 A * | 11/2000 | Moden et al. | 257/686 |
| 6,157,541 A | 12/2000 | Hacke | |
| 6,165,817 A * | 12/2000 | Akram et al. | 438/118 |
| 6,190,944 B1 * | 2/2001 | Choi | 438/109 |
| 6,208,521 B1 * | 3/2001 | Nakatsuka | 361/749 |
| 6,225,688 B1 | 5/2001 | Kim et al. | |
| 6,258,623 B1 | 7/2001 | Moden et al. | |
| 6,262,895 B1 | 7/2001 | Forthun | |
| 6,291,892 B1 * | 9/2001 | Yamaguchi | 257/778 |
| 6,297,544 B1 * | 10/2001 | Nakamura et al. | 257/666 |
| 6,300,679 B1 | 10/2001 | Mukerji et al. | |
| 6,323,060 B1 | 11/2001 | Isaak | |
| 6,337,510 B1 * | 1/2002 | Chun-Jen et al. | 257/666 |
| 6,376,769 B1 * | 4/2002 | Chung | 174/524 |
| 6,380,619 B2 * | 4/2002 | Ahiko et al. | 257/703 |
| 6,380,624 B1 * | 4/2002 | Hung | 257/723 |
| 6,404,662 B1 * | 6/2002 | Cady et al. | 365/63 |
| 6,424,031 B1 | 7/2002 | Glenn | 257/686 |
| 6,458,617 B1 * | 10/2002 | Liao et al. | 438/51 |
| 6,483,718 B2 * | 11/2002 | Hashimoto | 361/803 |
| 6,486,544 B1 | 11/2002 | Hashimoto | |
| 6,509,639 B1 * | 1/2003 | Lin | 257/686 |
| 6,528,870 B2 * | 3/2003 | Fukatsu et al. | 257/685 |
| 6,563,223 B2 | 5/2003 | Freeman | |
| 6,564,454 B1 * | 5/2003 | Glenn et al. | 29/852 |
| 6,576,992 B1 | 6/2003 | Cady et al. | |
| 6,600,222 B1 * | 7/2003 | Levardo | 257/686 |
| 6,608,371 B2 * | 8/2003 | Kurashima et al. | 257/686 |
| 6,611,052 B2 * | 8/2003 | Poo et al. | 257/686 |
| 6,617,671 B1 * | 9/2003 | Akram | 257/668 |
| 6,667,544 B1 * | 12/2003 | Glenn | 257/686 |
| 6,683,377 B1 * | 1/2004 | Shim et al. | 257/723 |
| 6,717,250 B1 * | 4/2004 | Emoto | 257/686 |
| 6,730,855 B2 | 5/2004 | Bando | |
| 6,756,251 B2 | 6/2004 | Lee | |
| 6,768,191 B2 * | 7/2004 | Wennemuth et al. | 257/686 |
| 6,773,955 B2 * | 8/2004 | Moden et al. | 438/106 |
| 6,785,144 B1 * | 8/2004 | Akram | 361/749 |
| 6,858,922 B2 * | 2/2005 | Pavier | 257/676 |
| 6,867,496 B1 | 3/2005 | Hashimoto | |
| 6,884,653 B2 | 4/2005 | Larson | |
| 6,897,553 B2 * | 5/2005 | King et al. | 257/686 |
| 6,914,324 B2 | 7/2005 | Rapport et al. | |
| 6,919,626 B2 * | 7/2005 | Burns | 257/686 |
| 6,940,729 B2 | 9/2005 | Cady et al. | |
| 6,955,945 B2 | 10/2005 | Rapport et al. | |
| 6,956,284 B2 | 10/2005 | Cady et al. | |
| 6,975,035 B2 | 12/2005 | Lee | |
| 6,984,885 B1 * | 1/2006 | Harada et al. | 257/696 |
| 6,992,376 B2 * | 1/2006 | Jaeck | 257/688 |
| 7,026,708 B2 | 4/2006 | Cady et al. | |
| 7,030,488 B2 * | 4/2006 | Kiss | 257/723 |
| 7,033,861 B1 * | 4/2006 | Partridge et al. | 438/109 |
| 7,033,911 B2 * | 4/2006 | Manepalli et al. | 438/455 |
| 7,053,478 B2 | 5/2006 | Roper et al. | |
| 7,087,442 B2 * | 8/2006 | Oppermann et al. | 438/15 |
| 7,087,459 B2 * | 8/2006 | Koh | 438/109 |
| 7,091,061 B2 * | 8/2006 | King et al. | 438/107 |
| 7,126,209 B2 | 10/2006 | Minamio et al. | |
| 7,126,829 B1 * | 10/2006 | Yen | 361/803 |
| 7,132,754 B1 * | 11/2006 | Schmidt | 257/778 |
| 7,180,168 B2 * | 2/2007 | Imai | 257/686 |
| 7,227,249 B1 * | 6/2007 | Chiang | 257/686 |
| 7,247,933 B2 * | 7/2007 | Juskey et al. | 257/686 |
| 7,285,442 B2 * | 10/2007 | Moden et al. | 438/107 |
| 7,291,906 B2 * | 11/2007 | Cha et al. | 257/686 |
| 7,309,923 B2 * | 12/2007 | Kee | 257/777 |
| RE40,061 E * | 2/2008 | Ball | 438/109 |
| 7,358,444 B2 * | 4/2008 | Nickerson et al. | 174/254 |
| 7,410,832 B2 * | 8/2008 | Lee et al. | 438/118 |
| 7,417,308 B2 * | 8/2008 | Park | 257/686 |
| 7,425,758 B2 * | 9/2008 | Corisis et al. | 257/686 |
| 7,436,055 B2 * | 10/2008 | Hu | 257/686 |
| 7,468,553 B2 * | 12/2008 | Szewerenko et al. | 257/686 |
| 7,476,962 B2 * | 1/2009 | Kim | 257/686 |
| 7,479,408 B2 * | 1/2009 | Lee | 438/109 |
| 7,495,334 B2 * | 2/2009 | Rapport et al. | 257/738 |
| 7,503,155 B2 * | 3/2009 | Meyers | 53/396 |
| 2001/0040793 A1 | 11/2001 | Inaba | 361/749 |
| 2002/0043658 A1 * | 4/2002 | Mess et al. | 257/2 |
| 2002/0164838 A1 * | 11/2002 | Moon et al. | 438/107 |
| 2002/0180022 A1 * | 12/2002 | Emoto | 257/686 |
| 2003/0164540 A1 | 9/2003 | Lee et al. | |
| 2003/0164543 A1 | 9/2003 | Kheng Lee | |
| 2003/0164548 A1 | 9/2003 | Lee | |
| 2003/0164551 A1 | 9/2003 | Lee et al. | |
| 2003/0166312 A1 | 9/2003 | Lee | |
| 2004/0000707 A1 * | 1/2004 | Roper et al. | 257/686 |
| 2004/0036170 A1 | 2/2004 | Lee et al. | |
| 2004/0124527 A1 * | 7/2004 | Chiu | 257/723 |
| 2004/0229402 A1 | 11/2004 | Cady et al. | |
| 2005/0051880 A1 * | 3/2005 | Lee et al. | 257/678 |
| 2005/0098873 A1 * | 5/2005 | Wehrly, Jr. | 257/692 |
| 2005/0110128 A1 * | 5/2005 | Ahn et al. | 257/686 |
| 2005/0189627 A1 * | 9/2005 | Ito et al. | 257/666 |
| 2005/0280135 A1 | 12/2005 | Rapport et al. | |
| 2006/0138628 A1 * | 6/2006 | Tzu | 257/686 |
| 2008/0054437 A1 * | 3/2008 | Hwang | 257/686 |

FOREIGN PATENT DOCUMENTS

| | | |
|---|---|---|
| WO | WO 99/65282 A1 | 12/1999 |

* cited by examiner

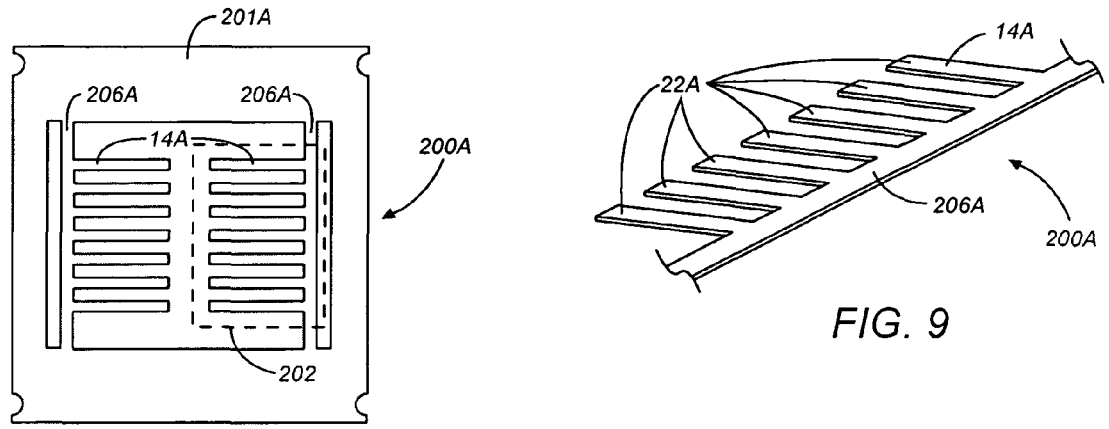
FIG. 8
FIG. 9
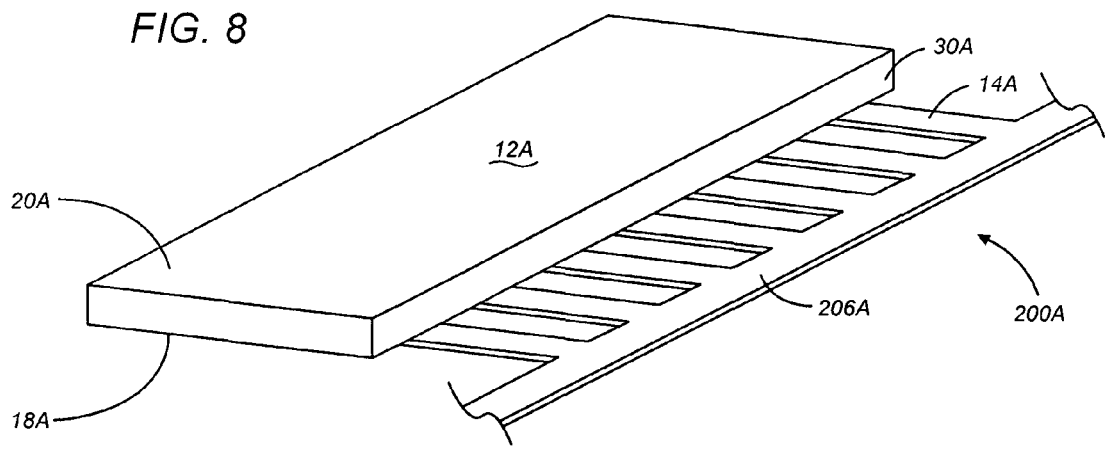
FIG. 10
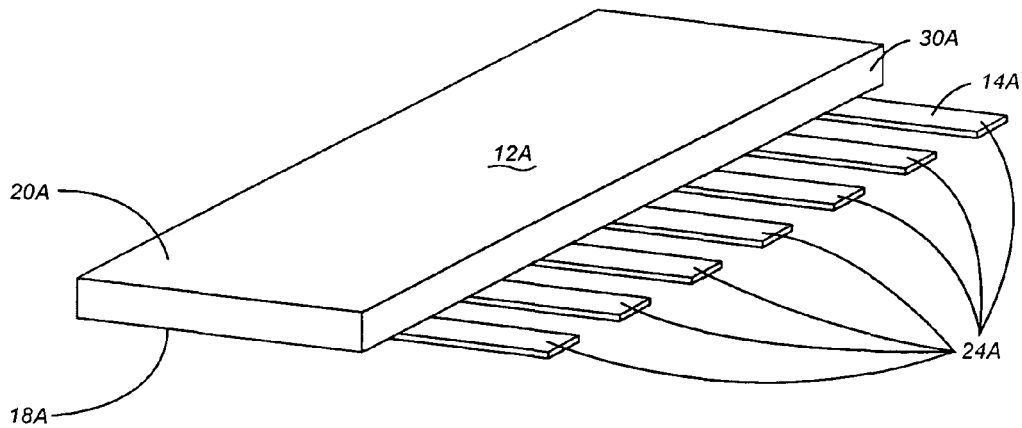
FIG. 11

SEMICONDUCTOR DEVICE ASSEMBLIES AND SYSTEMS INCLUDING AT LEAST ONE CONDUCTIVE PATHWAY EXTENDING AROUND A SIDE OF AT LEAST ONE SEMICONDUCTOR DEVICE

BACKGROUND OF THE INVENTION

1. Field of the Invention

Embodiments of the present invention relate generally to semiconductor device assemblies that include more than one semiconductor die. More specifically, embodiments of the present invention relate generally to semiconductor device assemblies that include electrically conductive paths that provide electrical communication between semiconductor dice in such semiconductor device assemblies and conductive structures of a substrate to which the semiconductor dice are structurally and electrically coupled. Embodiments of the present invention further relate to semiconductor device assemblies, to methods of fabricating such semiconductor device assemblies and to systems that include such semiconductor device assemblies.

2. Background of Related Art

In order to conserve the amount of surface area, or "real estate," consumed on a carrier substrate, such as a circuit board, by semiconductor devices coupled thereto, various types of increased circuit density semiconductor devices have been developed. Some types of semiconductor device assemblies include semiconductor dice or semiconductor device packages that are stacked one over another. Among these various types of semiconductor devices are stacked multi-chip modules (MCMs) and package-on-package (POP) assemblies. The amount of surface area on a carrier substrate that may be saved by stacking semiconductor dice or semiconductor device packages is readily apparent. A stack of semiconductor dice or semiconductor device packages may consume roughly as little real estate on a carrier substrate as a single, horizontally oriented semiconductor die or semiconductor device package.

Another benefit of stacked semiconductor device assemblies is flexibility in manufacturing, as they provide a variety of configurations, while enabling high-volume semiconductor device production. By way of example and not limitation, stacked semiconductor device assemblies may be manufactured that combine various numbers of like semiconductor devices, such as dynamic random-access memory (DRAM) devices, providing a memory module that may be configured to a selected storage capacity. Stacked semiconductor device assemblies may also be manufactured that combine various numbers of different semiconductor devices. For example, a semiconductor device assembly may include a DRAM device, a non-volatile Flash memory device, and an application specific integrated circuit (ASIC) device, thereby combining the functionality of each semiconductor device into a single module. This is advantageous, as one may use a relatively small variety of semiconductor devices, which may be combined in a diversity of ways, and create a large variety of stacked semiconductor device assemblies with differing functionalities.

Semiconductor device assemblies typically include electrically conductive paths that provide electrical communication between the dice and a substrate to which dice are, or may be, attached. The electrically conductive paths are conventionally formed on or within a substrate, which provides them with support and mutual electrical isolation. Various designs of semiconductor device assemblies including such conductive paths have been disclosed in the art.

U.S. Pat. No. 5,977,640, to Bertin et al., which issued Nov. 2, 1999, discloses a stacked multi-chip module, including a chip-on-chip (COC) component, where the active region of a first chip is electrically coupled to the active region of a second chip. The COC component is coupled to a substrate, the upper surface of the substrate having solderable metallurgical pads and the lower surface having solder balls. Multiple components can then be stacked and coupled, with the solder balls on the bottom surface of a component corresponding to the metallurgical pads on the top surface of another component.

U.S. Pat. No. 6,020,629, to Farnworth et al., which issued Feb. 1, 2000 and is assigned to the assignee of the present invention, discloses a stacked multi-chip module, including multiple substrates, each having a semiconductor die mounted thereon. Each substrate includes matching patterns of external contacts and contact pads formed on opposing sides of the substrate. Interlevel conductors through the substrate interconnect the external contacts and contact pads. The external contact pads on a substrate are bonded to the contact pads on an adjacent substrate, such that all of the dice in the package are interconnected.

U.S. Pat. No. 6,072,233, to Corisis et al., which issued Jun. 6, 2000 and is assigned to the assignee of the present invention, discloses a package-on-package assembly in which fine ball grid array (FBGA) packages are stacked one upon another. Each FBGA package is configured such that conductive elements on the package extend beyond one or more of the major surfaces and make contact with adjacent FBGA packages in the stack.

U.S. Pat. No. 6,225,688, to Kim et al., which issued May 1, 2001, discloses a stacked multi-chip module, which includes a flexible substrate having a wiring layer with conductive paths extending to a plurality of attachment sites. A plurality of microelectronic components is assembled to the attachment sites, and the flexible substrate is folded so as to provide a stacked assembly with conductive terminals exposed at the bottom end of the stack.

U.S. Pat. No. 6,323,060, to Isaak, which issued Nov. 27, 2001, discloses a stacked multi-chip module, including multiple flex circuit integrated circuit (IC) packages. The patent teaches a flex circuit, which is comprised of a flexible base with a conductive pattern disposed thereon, that is wrapped around a frame, having an IC device mounted there within. The conductive pattern of the flex circuit is electrically coupled to the IC device, forming a stackable flex circuit IC package. Multiple flex circuit IC packages can then be stacked and electrically coupled using a conductive epoxy.

BRIEF DESCRIPTION OF THE DRAWINGS

While the specification concludes with claims particularly pointing out and distinctly claiming that which is regarded as the present invention, the advantages of the embodiments of the present invention can be more readily ascertained from the following description of various embodiments of the invention when read in conjunction with the accompanying drawings in which:

FIGS. 8-17 illustrate one example of a method for forming a semiconductor device assembly that embodies teachings of the present invention;

DETAILED DESCRIPTION OF THE ILLUSTRATED EMBODIMENTS

Figure 1:
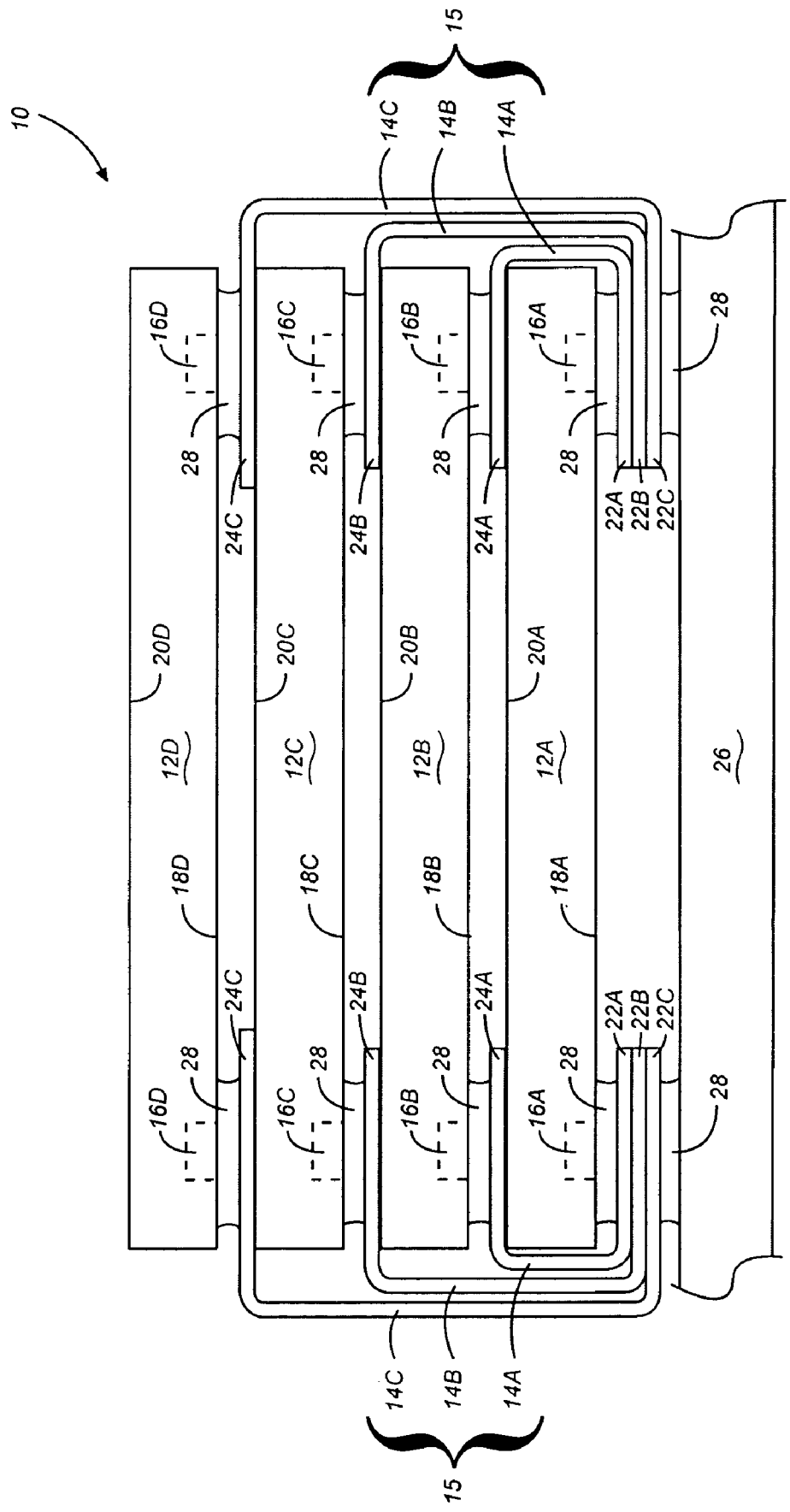
FIG. 1 is a side view of one example of a semiconductor device assembly that embodies teachings of the present invention.

In the description which follows, like features and elements may be identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

In one embodiment, the present invention includes a semiconductor device assembly that includes a plurality of semiconductor devices stacked one over another. At least one conductive pathway extends around a side of one semiconductor device in the assembly such that a first end thereof extends generally over a first major surface thereof and a second end extends generally over a second major surface thereof. The conductive pathway may include a self-supporting conductive lead or a conductive trace carried by a carrier substrate. Optionally, the semiconductor device assembly may include an additional conductive pathway that communicates electrically with the first conductive pathway and extends around the sides of at least two semiconductor devices of the assembly.

In another embodiment, the present invention includes a system having at least one electronic signal processor configured to communicate electrically with at least one memory device. At least one of the at least one electronic signal processor and the at least one memory device includes a semiconductor device assembly that includes a plurality of semiconductor devices stacked one over another. At least one conductive pathway extends around a side of one semiconductor device in the assembly such that a first end thereof extends generally over a first major surface thereof and a second end extends generally over a second major surface thereof. The at least one conductive pathway may include a self-supporting conductive lead or a conductive trace carried by a carrier substrate. Optionally, an additional conductive pathway may communicate electrically with the first conductive pathway and extend around the sides of at least two semiconductor devices of the assembly.

In yet another embodiment, the present invention includes a method of forming a semiconductor device assembly that includes at least two semiconductor devices. The method includes structurally and electrically coupling a conductive element of a first semiconductor device to an end of a conductive pathway and bending the conductive pathway around a side of the semiconductor device to position another end of the conductive pathway on an opposite side of the semiconductor device. A second semiconductor device then may be structurally and electrically coupled to the end of the conductive pathway positioned on the opposite side of the semiconductor device.

Several non-limiting examples of various embodiments of the present invention are described in further detail below.

Referring to FIG. 1, an embodiment of the present invention in the form of semiconductor device assembly 10 that comprises a plurality of semiconductor devices 12A-12D is depicted. As shown in FIG. 1, the semiconductor devices 12A-12D may be substantially bare semiconductor dice.

The semiconductor device assembly 10 may include a first semiconductor device 12A, a second semiconductor device 12B, a third semiconductor device 12C, and a fourth semiconductor device 12D. In additional embodiments, the semiconductor device assembly 10 may include only two, only three, or more than four semiconductor devices. In some embodiments, the semiconductor device assembly 10 may also comprise a substrate 26, such as a printed circuit board (PCB). By way of example and not limitation, the substrate 26 may be or include an interposer substrate, a motherboard or daughterboard of a computer system, or other carrier substrate.

Each of the semiconductor devices 12A-12D may include a respective first major surface 18A-18D and a respective opposing second major surface 20A-20D. The semiconductor devices 12A-12D may further include conductive elements 16A-16D, respectively, on or in their corresponding first major surface 18A-18D. However, additional conductive elements may be disposed on or in one or more of the second major surfaces 20A-20D. By way of example and not limitation, the conductive elements 16A-16D may comprise bond pads, either at original or redistributed locations over the active surface. The conductive elements 16A-16D may communicate electrically with components (e.g., transistors, capacitors, etc.) of integrated circuits (not shown) contained within each of the respective semiconductor devices 12A-12D.

The semiconductor devices 12A-12D may be configured in a stacked configuration, one stacked over the other, as depicted in FIG. 1. For example, the first semiconductor device 12A may be situated over a substrate 26 with its first major surface 18A adjacent the substrate 26. The second semiconductor device 12B may be situated over the first semiconductor device 12A, the third semiconductor device 12C over the second semiconductor device 12B, and the fourth semiconductor device 12D over the third semiconductor device 12C. As shown in FIG. 1, in one particular non-limiting embodiment, set forth merely as an example, the first major surface 18B of the second semiconductor device 12B may be disposed adjacent the second major surface 20A of the first semiconductor device 12A, the first major surface 18C of the third semiconductor device 12C may be disposed adjacent the first major surface 18B of the second semiconductor device 12B, and the first major surface 18D of the fourth semiconductor device 12D may be disposed adjacent the second major surface 20C of the third semiconductor device 12C.

The semiconductor device assembly 10 may further include a plurality of self-supporting conductive leads. As used herein, the term "self-supporting conductive leads" is used in a non-limiting sense and includes elongated conductive paths, comprising a metal or metal alloy, that are supported by the metal or metal alloy from which they are formed and are not externally supported or carried by a substrate as are the conductive traces and vias of printed circuit boards (PCB), flexible printed wiring (FPW), or tape automated bonding (TAB) and the like, which are disposed on or within a dielectric substrate that provides support and electrical insulation. For example, the semiconductor device assembly 10 may include a first plurality of self-supporting conductive leads 14A, a second plurality of self-supporting conductive leads 14B, and a third plurality of self-supporting conductive leads 14C. Each self-supporting conductive lead 14A-14C has a first end 22A-22C, respectively, and a second end 24A-24C, respectively. In some embodiments, each of the second plurality of self-supporting conductive leads 14B may be longer than each of the first plurality of self-supporting conductive leads 14A, and each of the third plurality of self-supporting conductive leads 14C may be longer than each of the second plurality of self-supporting conductive leads 14B, as shown in FIG. 1.

The self-supporting conductive leads 14A-14C may be arranged in a plurality of lead stacks 15, each lead stack 15 comprising one self-supporting conductive lead 14A, one self-supporting conductive lead 14B, and one self-supporting conductive lead 14C. In the embodiment shown in FIG. 1, the semiconductor device assembly 10 includes a plurality of lead stacks 15 disposed along each of two sides of the semiconductor device assembly 10. In additional embodiments, lead stacks 15 may be disposed along only one side of the semiconductor device assembly 10, or along more than two sides of the semiconductor device assembly 10.

As shown in FIG. 1, each self-supporting conductive lead 14A may wrap around the side of the first semiconductor device 12A, such that the first end 22A thereof extends generally over a portion of the first major surface 18A of the first semiconductor device 12A, and the second end 24A extends generally over the second major surface 20A of the first semiconductor device 12A. Each second self-supporting conductive lead 14B may wrap around the sides of both the first and second semiconductor devices 12A and 12B, such that the first end 22B thereof extends generally over the first end 22A of a first self-supporting conductive lead 14A, and the second end 24B thereof extends generally over the second major surface 20B of the second semiconductor device 12B. Similarly, each third self-supporting conductive lead 14C may wrap around the sides of each of the first, second, and third semiconductor devices 12A-12C, such that the first end 22C thereof extends generally over the first end 22B of a second self-supporting conductive lead 14B, and the second end 24C thereof extends generally over the second major surface 20C of the third semiconductor device 12C.

In this configuration, the first ends 22A-22C of the self-supporting conductive leads 14A-14C in each lead stack 15 may be situated one over another, such that the first end 22A of the first self-supporting conductive lead 14A is disposed between the first major surface 18A of the first semiconductor device 12A and the first end 22B of the second self-supporting conductive lead 14B, and the first end 22B of the second self-supporting conductive lead 14B is disposed between the first end 22A of the first self-supporting conductive lead 14A and the first end 22C of the third self-supporting conductive lead 14C. Electrical communication may be established between the self-supporting conductive leads 14A-14C of each lead stack 15. For example, electrical communication may be established between the first ends 22A-22C of the self-supporting conductive leads 14A-14C of each lead stack 15. In some embodiments, the first ends 22A-22C of the self-supporting conductive leads 14A-14C in each lead stack 15 may be structurally and electrically coupled together by, for example, using a conductive adhesive, a soldering process, a brazing process, or a welding process (e.g., a spot welding process).

As shown in FIG. 1, each conductive element 16A of the first semiconductor device 12A may be structurally and electrically coupled to a first end 22A of a first self-supporting conductive lead 14A using conductive material 28. Each conductive element 16B of the second semiconductor device 12B may be structurally and electrically coupled to a second end 24A of a first self-supporting conductive lead 14A using conductive material 28. Similarly, each conductive element 16C of the third semiconductor device 12C may be structurally and electrically coupled to a second end 24B of a second self-supporting conductive lead 14B using conductive material 28, and each conductive element 16D of the third semiconductor device 12D may be structurally and electrically coupled to a second end 24C of a third self-supporting conductive lead 14C using conductive material 28. By way of example and not limitation, the conductive material 28 may include solder material (e.g., solder balls, solder bumps; etc.), conductive or conductor-filled epoxy, anisotropically conductive film, or any other suitable conductive material that may be used to structurally and electrically couple together the respective conductive structures (such as, for example, bond pads and conductive leads).

Additionally, each lead stack 15 may be structurally and electrically coupled to conductive terminals and/or traces (not shown) of the substrate 26 using, for example, conductive material 28. In this configuration, electrical communication may be established between the components of the integrated circuits (not shown) contained within each semiconductor device 12A-12D and conductive terminals and/or traces of the substrate 26 through the self-supporting conductive leads 14A-14C.

As will be apparent to those of ordinary skill in the art, it is not necessary that all lead stacks 15 of the semiconductor device assembly 10 communicate electrically with each of the semiconductor devices 12A-12D. For example, some of the lead stacks may be configured as "chip-select" lead stacks and may communicate with only one of the semiconductor devices 12A-12D. In such chip-select lead stacks, non-conductive material (not shown) may be used in place of the conductive material 28 as necessary to electrically insulate one or more of the semiconductor devices 12A-12D from the self-supporting conductive leads 14A-14C of such chip-select lead stacks.

Figure 2:
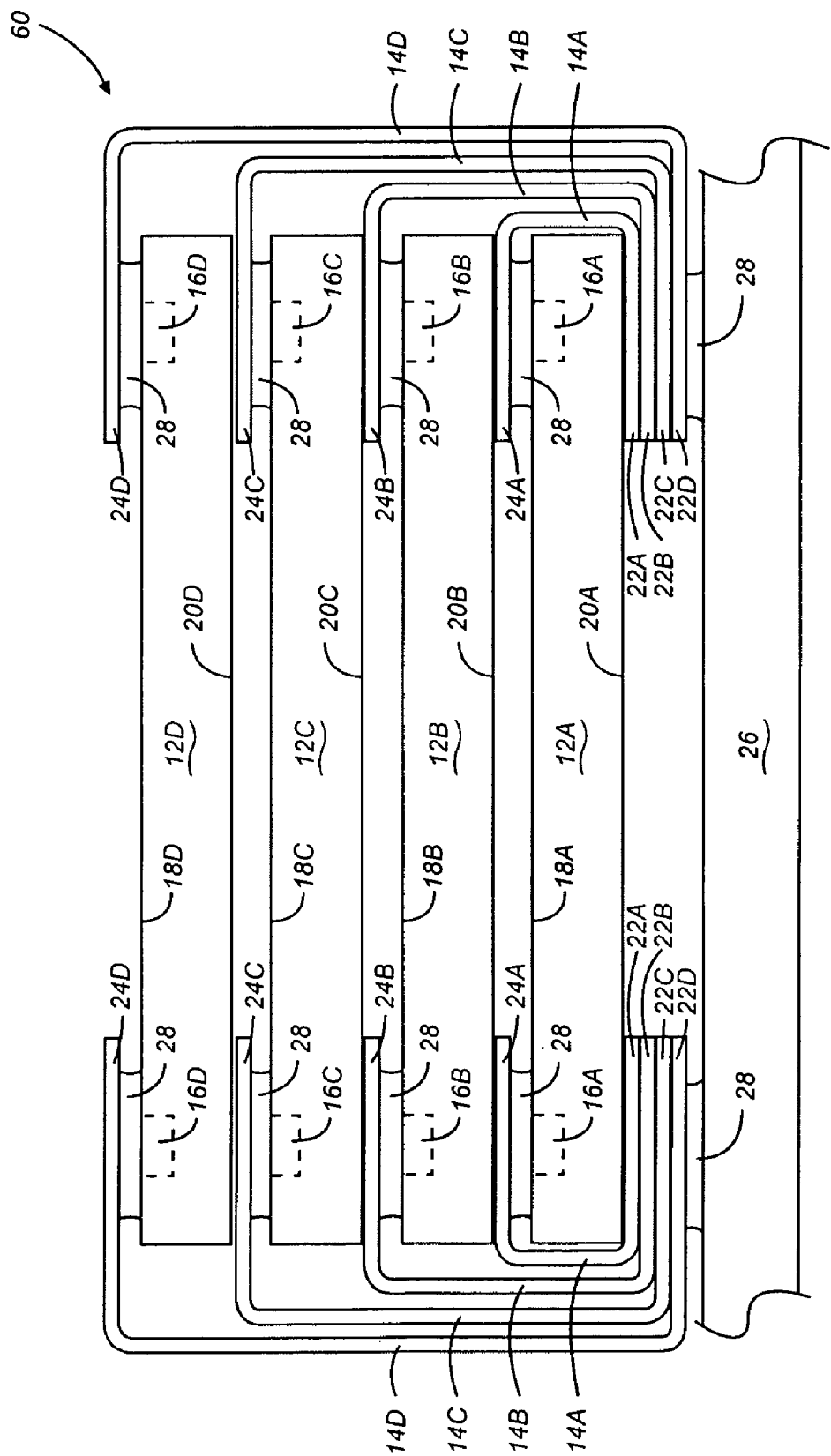
FIG. 2 is a side view of another example of a semiconductor device assembly that embodies teachings of the present invention.

FIG. 2 illustrates another embodiment of the present invention in the form of semiconductor device assembly 60. The semiconductor device assembly 60 is generally similar to the semiconductor device assembly 10 shown in FIG. 1, and may include a plurality of semiconductor devices 12A-12D, which may be coupled to a substrate 26. The semiconductor device assembly 60 includes a plurality of self-supporting conductive leads, which may include the conductive leads 14A-14C, and an additional fourth plurality of self-supporting conductive leads 14D.

As illustrated in this example, the semiconductor devices 12A-12D of the semiconductor device assembly 60 may be situated with their respective first major surfaces 18A-18D facing upwards, away from the substrate 26. Each self-supporting conductive lead 14D of the additional fourth plurality of self-supporting conductive leads 14D, may extend over the sides of semiconductor devices 12A-12D. The second end 24D of each self-supporting conductive lead 14D may extend generally over the first major surface 18D of the fourth semiconductor device 12D, and the first end 22D of each self-supporting conductive lead 14D may extend generally over the first end 22C of a third self-supporting conductive lead 14C. Additionally, the conductive elements 16A-16D of the semiconductor devices 12A-12D may be structurally and electrically coupled to the corresponding second ends 24A-24D of the self-supporting conductive leads 14A-14D using conductive material 28, in a manner substantially similar to that previously described in relation to the semiconductor device assembly 10 shown in FIG. 1.

Figure 3:
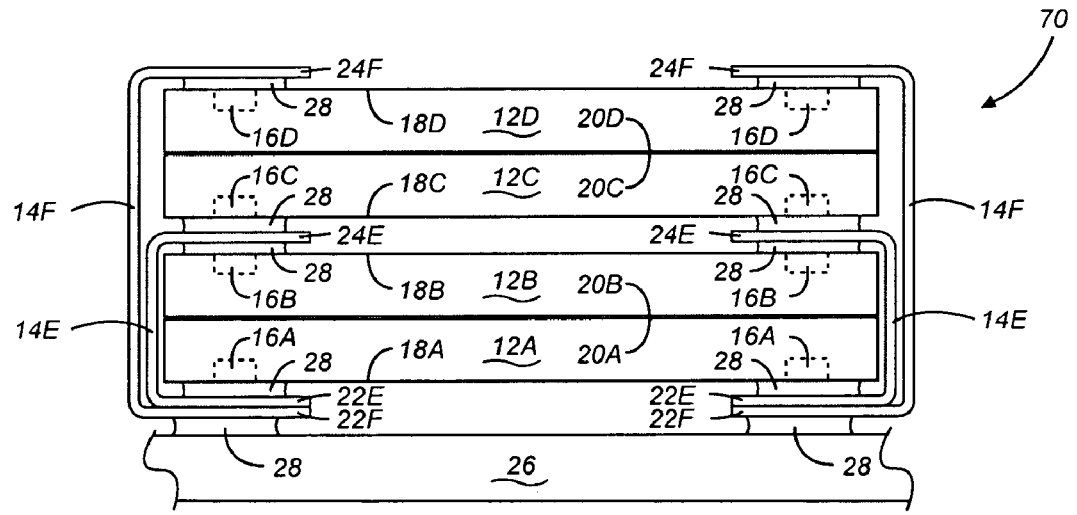
FIG. 3 is a side view of another example of a semiconductor device assembly that embodies teachings of the present invention.

FIG. 3 illustrates yet another embodiment of the present invention in the form of semiconductor device assembly 70. The semiconductor device assembly 70 is generally similar to the semiconductor device assembly 10 shown in FIG. 1, and may include a plurality of semiconductor devices 12A-12D, which may be coupled to a substrate 26. The semiconductor device assembly 70 includes a plurality of self-supporting conductive leads. For example, the semiconductor device assembly 70 may include a first plurality of self-supporting conductive leads 14E and a second plurality of self-supporting conductive leads 14F, each having a respective first end 22E and 22F and a respective second end 24E and 24F.

As illustrated in FIG. 3, the first major surfaces 18A and 18C of the. semiconductor devices 12A and 12C may face downwards, towards the substrate 26, and the first major surfaces 18B and 18D of the semiconductor devices 12B and 12D may face upwards, away from the substrate 26.

With continued reference to FIG. 3, the first ends 22E of the first plurality of self-supporting conductive leads 14E may be disposed between the first major surface 18A of the first semiconductor device 12A and the first ends 22F of the second plurality of self-supporting conductive leads 14F. In this configuration, a first side of each of the first ends 22E of the self-supporting conductive leads 14E may be structurally and electrically coupled to the conductive elements 16A of the first semiconductor device 12A using conductive material 28, and a second side of each of the first ends 22E of the self-supporting conductive leads 14E may be structurally and electrically coupled to a first side of the first end 22F of a second self-supporting conductive lead 14F. The first ends 22F of the second plurality of self-supporting conductive leads 14F may be disposed between a substrate 26 and the first ends 22E of the first plurality of self-supporting conductive leads 14E. A second side of each of the first ends 22F of the second self-supporting conductive leads 14F may be structurally and electrically coupled to the substrate 26 using conductive material 28.

The second ends 24E of the first self-supporting conductive leads 14E, may be disposed between the first major surface 18B of the second semiconductor device 12B and the first major surface 18C of the third semiconductor device 12C. The second end 24E of each of the first conductive leads 14E may be structurally and electrically coupled to both a conductive element 16B of the second semiconductor device 12B and a conductive element 16C of the third semiconductor device 12C using conductive material 28, as shown in FIG. 3. The second end 24F of each of the second self-supporting conductive leads 14F may extend over the first major surface 18D of the fourth semiconductor device 12D and may be structurally and electrically coupled to a conductive elements 16D of the fourth semiconductor device 12D using conductive material 28.

Figure 4:
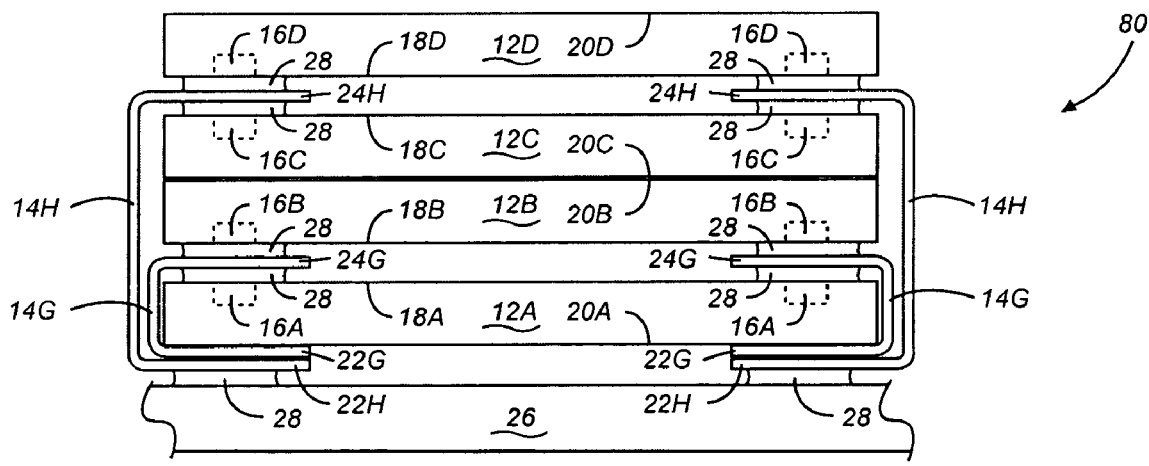
FIG. 4 is a side view of another example of a semiconductor device assembly that embodies teachings of the present invention.

FIG. 4 illustrates another embodiment of the present invention in the form of semiconductor device assembly 80. The semiconductor device assembly 80 is generally similar to the semiconductor device assembly 10 shown in FIG. 1, and may include a plurality of semiconductor devices 12A-12D, which may be coupled to a substrate 26. The semiconductor device assembly 80 may include a plurality of self-supporting conductive leads. For example, the semiconductor device assembly 80 may include a first plurality of self-supporting conductive leads 14G and a second plurality of self-supporting conductive leads 14H, each having a respective first end 22G and 22H and a respective second end 24G and 24H.

As illustrated in FIG. 4, the first major surfaces 18A and 18C of the semiconductor devices 12A and 12C may face upwards, away from the substrate 26, and the first major surfaces 18B and 18D of the semiconductor devices 12B and 12D may face downwards, towards the substrate 26.

The first ends 22G and 22H of the self-supporting conductive leads 14G and 14H may be configured substantially identical to the first ends 22E and 22F of the self-supporting conductive leads 14E and 14F shown in FIG. 3, with the exception that the first end 22G of the self-supporting conductive lead 14G is not structurally and electrically coupled directly to a conductive element 16A of the first semiconductor device 12A, as is the first end 22E of the self-supporting conductive lead 14E.

The second end 24G of each first self-supporting conductive lead 14G, may be disposed between the first major surface 18A of the first semiconductor device 12A and the first major surface 18B of the second semiconductor device 12B. Furthermore, a first side of the second end 24G of each first self-supporting conductive lead 14G may be structurally and electrically coupled directly to a conductive element 16A of the first semiconductor device 12A using conductive material 28, and a second side of the second end 24G of each first self-supporting conductive lead 14G may be structurally and electrically coupled directly to a conductive element 16B of the second semiconductor device 12B using conductive material 28. The second end 24H of each second self-supporting conductive leads 14H may be disposed between the first major surface 18C of the third semiconductor device 12C and the first major surface 18D of the fourth semiconductor device 12D. Furthermore, a first side of the second end 24H of each second self-supporting conductive lead 14H may be structurally and electrically coupled directly to a conductive element 16C of the third semiconductor device 12C using conductive material 28, and a second side of the second end 24H of each second self-supporting conductive lead 14H may be structurally and electrically coupled directly to a conductive element 16D of the fourth semiconductor device 12D using conductive material 28.

Figure 5:
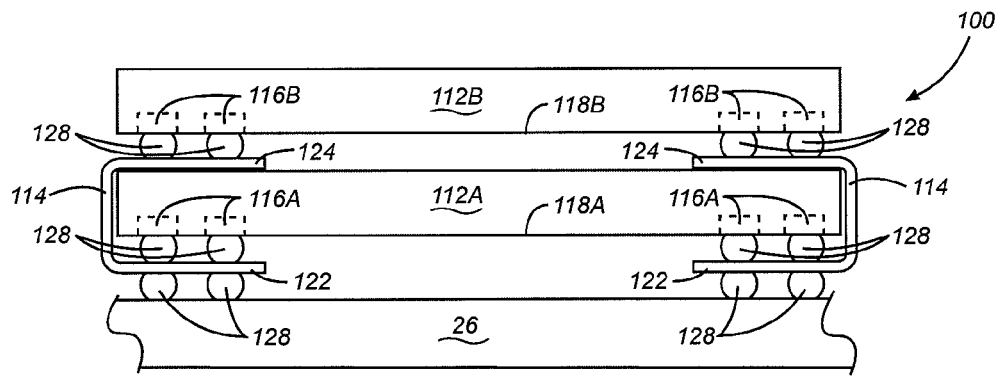
FIG. 5 is a cross-sectional side view of another example of a semiconductor device assembly that embodies teachings of the present invention.

As previously mentioned, it is not necessary that semiconductor device assemblies that embody teachings of the present invention include four semiconductor devices. FIG. 5 illustrates another embodiment of the present invention in the form of semiconductor device assembly 100 that includes only two semiconductor devices. For example, the semiconductor device assembly 100 may include a first substantially bare die 112A and a second substantially bare die 112B, which may be structurally and electrically coupled to a substrate 26. The semiconductor device assembly 100 further includes a plurality of self-supporting conductive leads 114, each having a first end 122, and a second end 124.

The semiconductor dice 112A and 112B may have bond pads 116A and 116B on or in their respective first major surfaces 118A and 118B. The bond pads 116A of the first semiconductor die 112A may be structurally and electrically coupled to the first ends 122 of the self-supporting conductive leads 114 using solder balls 128, and the bond pads 116B of the second semiconductor die 112B may be structurally and electrically coupled to the second ends 124 using solder balls 128. In addition, the first ends 122 also may be structurally and electrically coupled to the substrate 26 using solder balls 128. In additional embodiments, other solder structures (e.g., solder bumps, solder balls, etc.), conductive or conductor-filled epoxy, anisotropically conductive film, or any other conductive material that may be used to structurally and electrically couple together conductive structures may be used in addition to, or as an alternative to, the solder balls 128.

Figure 6:
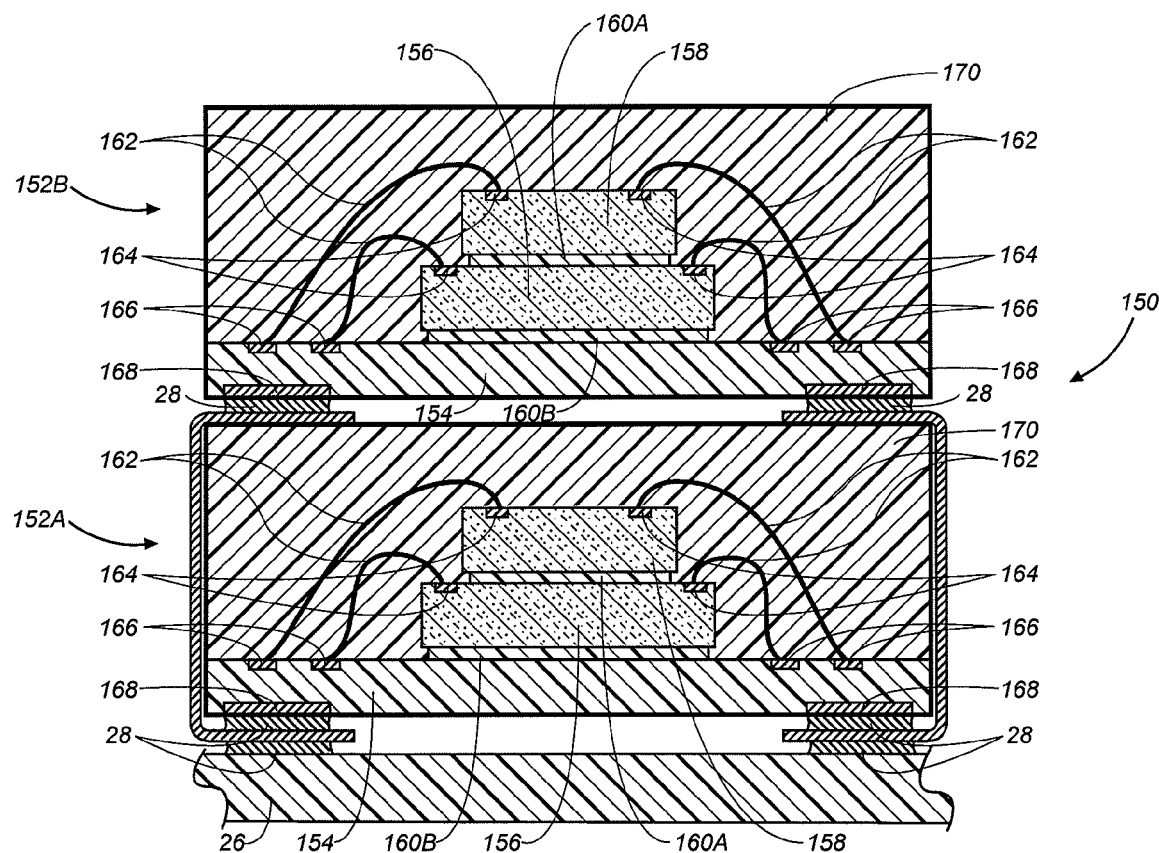
FIG. 6 is a cross-sectional side view of another example of a semiconductor device assembly that embodies teachings of the present invention.

In addition to substantially bare semiconductor dice, semiconductor device assemblies that embody teachings of the present invention may include other types of semiconductor devices, such as, for example, semiconductor device packages. FIG. 6 illustrates another semiconductor device assembly 150 that embodies teachings of the present invention in a somewhat different structural form. The semiconductor device assembly 150 is generally similar to the semiconductor device assembly 100 shown in FIG. 5. In contrast to substantially bare semiconductor dice of the semiconductor device assembly 100, however, the semiconductor device assembly 150 may include a first semiconductor device package 152A and a second semiconductor device package 152B. By way of example and not limitation, each of the first and second semiconductor device packages 152A and 152B may include a package substrate 154, a first semiconductor die 156, and a second semiconductor die 158. In additional embodiments, each of the semiconductor device packages 152A and 152B may include only one semiconductor die. In yet other embodiments, each of the semiconductor device packages 152A and 152B may include more than two semiconductor dice.

As shown in FIG. 6, the first and second semiconductor device packages 152A and 152B may be substantially identical in some embodiments of the present invention. In other embodiments, the second semiconductor device package 152B may differ from the first semiconductor device package 152A in at least one aspect. As shown in FIG. 6, in each of the first and second semiconductor device packages 152A and 152B, the first semiconductor die 156 may be situated generally over the package substrate 154, and the second semiconductor die 158 may be situated generally over the first semiconductor die 156. A dielectric spacer 160A may be disposed between the first semiconductor die 156 and the second semiconductor die 158. Similarly, another dielectric spacer 160B may be disposed between the first semiconductor die 156 and the package substrate 154. The dielectric spacers 160A and 160B may be used to electrically isolate each of the package substrate 154, the first semiconductor die 156, and the second semiconductor die 158 from one another. By way of example and not limitation, the dielectric spacers 160A and 160B may be or include a layer of disc comprising an electrically insulating material, such as, for example a polymer material (e.g., epoxy), a ceramic material (e.g., silica), or silicon.

Each of the first semiconductor die 156 and the second semiconductor die 158 may communicate electrically with the respective package substrate 154. By way of example and not limitation, bond wires 162 may be used to provide electrical communication between bond pads 164 on or in a surface of each semiconductor die 156 and 158 and corresponding conductive lands 166 on or in a surface of the package substrate 154. Conductive traces and/or vias (not shown) on and/or in the package substrates 154 may provide electrical communication between the conductive lands 166 and the conductive terminals 168.

Optionally, each of the semiconductor device packages 152A and 152B may include a dielectric encapsulant material 170, shown for purposes of illustration only as a transfer-molded encapsulant. By way of example and not limitation, an encapsulant material 170 may be disposed around the bond wires 162 and over at least a portion of the package substrate 154 and the semiconductor dice 156, 158. The semiconductor device packages 152A and 152B shown in FIG. 6 and described herein are disclosed merely as an example of one type of a semiconductor device package that may be used in semiconductor device assemblies that embody teachings of the present invention.

As will be apparent to those of ordinary skill in the art, the semiconductor device packages 152A and 152B shown in FIG. 6 have a "board-on-chip" (BOC) configuration. In additional embodiments, the semiconductor device packages 152A and 152B may have a "chip-on-board" (COB) configuration. Furthermore, each of the semiconductor device packages 152A and 152B may include semiconductor dice that are flip-chip bonded to the underlying semiconductor die or package substrate 154, and may not include bond wires 162. Various other types of semiconductor device packages are known in the art and may be used to provide additional semiconductor device assemblies that embody teachings of the present invention.

Each of the previously described semiconductor device assemblies include conductive pathways provided by self-supporting conductive leads extending between the semiconductor devices and the respective substrate 26. The present invention is not so limited, however, and such conductive pathways may be provided by conductive traces carried on or in a carrier substrate, such as, for example, those conventionally used in so-called "flex-circuit" and tape-automated bonding (TAB) applications.

Figure 7:
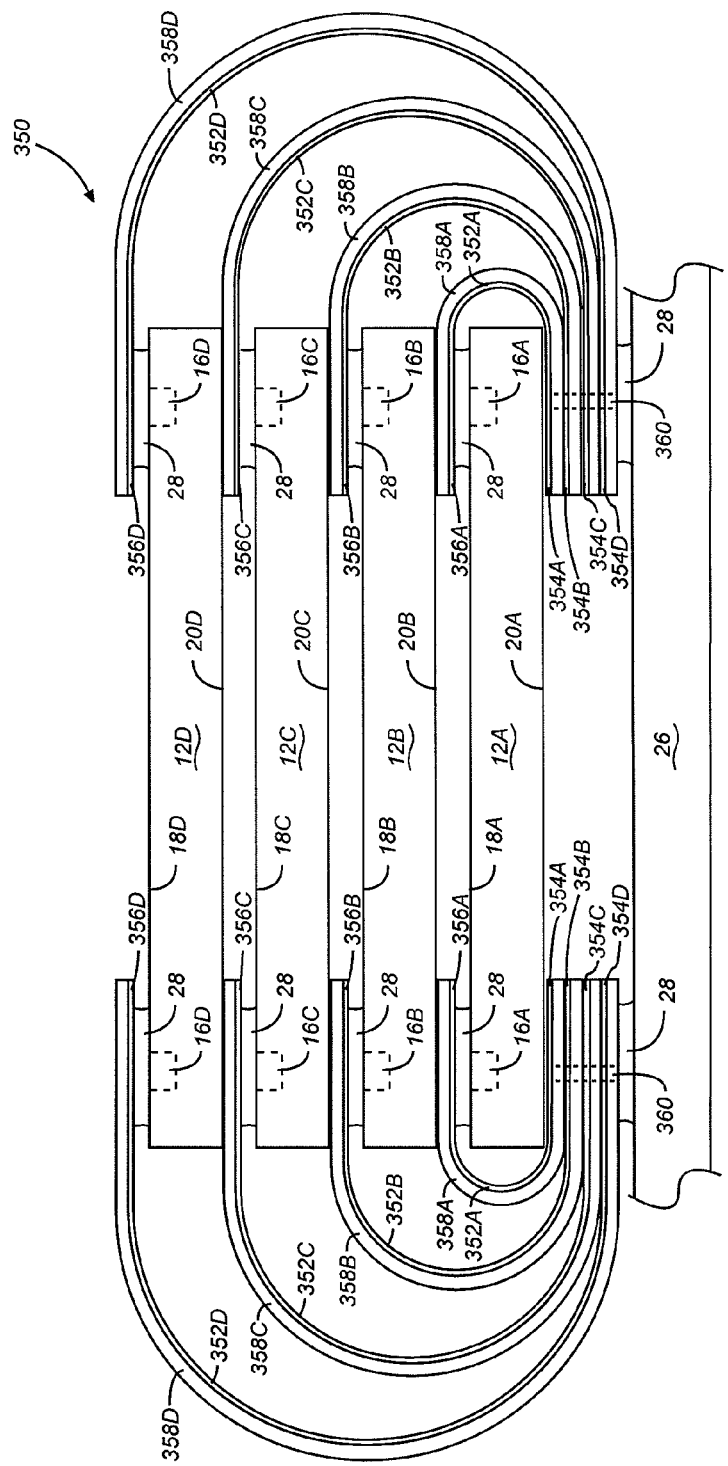
FIG. 7 is a cross-sectional side view of another example of a semiconductor device assembly that embodies teachings of the present invention.

The semiconductor device assembly 350 shown in FIG. 7 illustrates an example of a semiconductor device assembly 350 that embodies teachings of the present invention and includes conductive traces 352A-352D carried on or in a carrier substrate 358A-358D. The semiconductor device assembly 350 is generally similar to the previously described semiconductor device assembly 60 shown in FIG. 2, and may include a plurality of semiconductor devices 12A-12D. The semiconductor device assembly 350 may further include a first plurality of conductive traces 352A carried by at least one first layer carrier substrate 358A, a second plurality of conductive traces 352B carried by at least one second layer carrier substrate 358B, a third plurality of conductive traces 352C carried by at least one third layer carrier substrate 358C, and a fourth plurality of conductive traces 352D carried by at least one fourth layer carrier substrate 358D. In the embodiment shown in FIG. 7, the semiconductor device assembly 350 includes two first layer carrier substrates 358A, two second layer carrier substrates 358B, two third layer carrier substrates 358C, and two fourth layer carrier substrates 358D. The carrier substrates 358A-358D are configured to wrap generally around two sides of each of the semiconductor devices 12A-12D. The carrier substrates 358A-358D may, respectively, provide structural support for conductive traces 352A-352D.

In additional embodiments, the semiconductor device assembly 350 may include only one of each of the first through fourth layers of carrier substrates 358A-358D, or more than two of each of the first through fourth layers of carrier substrates 358A-358D. Furthermore, the carrier substrates 358A-358D may be configured to wrap generally around only one side of each of the semiconductor devices 12A-12D, or to wrap generally around more than two sides of each of the semiconductor devices 12A-12D.

By way of example and not limitation, the conductive traces 352A-352D each may include a conductive material such as, for example, copper or copper-based alloy (including alloys based on copper and beryllium), aluminum or aluminum-based alloy, nickel-chromium-iron superalloy (such as that sold under the trademark INCONEL®), or a conductive polymer material.

By way of example and not limitation, each of the carrier substrates 358A-358D may include a flexible dielectric material such as, for example, a polyimide or polyimide-based material, a polyester or polyester-based material, an aramid or aramid-based material, a reinforced composite material, or a fluorocarbon-based material (e.g., polytetrafluoroethylene).

As shown in FIG. 7, each conductive trace 352A-352D may have a respective first end 354A-354D and a respective second end 356A-356D. The conductive traces 352A and 352B may be configured to provide stacks of conductive traces, similar to the lead stacks 15 previously described in relation to FIG. 1. Electrical communication may be provided between the conductive traces 356A amd 356D in each stack at the first ends 354A-354D thereof. For example, in some embodiments, the conductive traces 352A-352D on each carrier substrate 358A-358D may have a substantially similar configuration, differing only in the length of the respective conductive traces 352A-352D. In this configuration, the first ends 354A-354D of the conductive traces 352A-352D may be aligned with one another by aligning the carrier substrates 358A-358D. By way of example and not limitation, through holes may be formed through the carrier substrates 358A-358D and each of the conductive traces 352A-352D in each trace stack. The through holes then may be aligned and filled with a conductive material, such as, for example, a conductive metal or metal alloy, to form conductive vias 360 that provide electrical communication between the conductive traces 352A-352D in each stack.

With continued reference to FIG. 7, the second end 356A of each of the first plurality of conductive traces 352A may be structurally and electrically coupled to a conductive element 16A of the first semiconductor device 12A using conductive material 28. The second end 356B of each of the second plurality of conductive traces 352B may be structurally and electrically coupled to a conductive element 16B of the second semiconductor device 12B using conductive material 28. Similarly, the second end 356C of each of the third plurality of conductive traces 352C may be structurally and electrically coupled to a conductive element 16C of the third semiconductor device 12C using conductive material 28. Finally, the second end 356D of each of the fourth plurality of conductive traces 352D may be structurally and electrically coupled to a conductive element 16D of the fourth semiconductor device 12D using conductive material 28.

In addition, the first ends 354A-354D may be structurally and electrically coupled to the substrate by way of vias 360 through the carrier substrates 358A-358D (e.g., flexible dielectric films) using conductive material 28.

Any of the previously described semiconductor device assemblies (e.g., the semiconductor device assembly 10 shown in FIG. 1, the semiconductor device assembly 60 shown in FIG. 2, the semiconductor device assembly 70 shown in FIG. 3, the semiconductor device assembly 80 shown in FIG. 4, the semiconductor device assembly 100 shown in FIG. 5, and the semiconductor device assembly 150 shown in FIG. 6) may include conductive pathways provided by conductive traces carried on or in a carrier substrate, in addition to, or as an alternative to, the previously described self-supporting conductive leads.

Additional embodiments of the present invention include methods of manufacturing semiconductor device assemblies. One example of a method that embodies teachings of the present invention and that may be used to manufacture a semiconductor device assembly, such as the semiconductor device assembly 10 shown in FIG. 1, is described below with reference to FIGS. 8-17.

Referring to FIG. 8, a first lead frame 200A may be provided that includes a first plurality of self-supporting conductive leads 14A. The self-supporting conductive leads 14A may be attached to a carrier strip 206A as shown in FIG. 8 (providing an integral tie bar extending laterally between self-supporting conductive leads 14A, and/or to an outer frame member 201A of the first lead frame 200A). The first lead frame 200A may further include additional tie bars (not shown), which may extend laterally between adjacent self-supporting conductive leads 14A to provide additional support to the first plurality of self-supporting conductive leads 14A during forming, as known in the art. The lead frame 200A may be formed by, for example, cutting, stamping, punching, or etching a sheet of metal or metal alloy, or by any other method known in the art for forming conventional lead frames.

The area of FIG. 8 enclosed within the dashed line 202 is illustrated in an enlarged perspective view in FIG. 9 to facilitate description thereof. As shown in FIG. 9, the first ends 22A of the self-supporting conductive leads 14A may be cantilevered from the carrier strip 206A (or other element of the lead frame 200A) and positioned in a generally central region of the lead frame 200A.

Referring to FIG. 10, a first semiconductor device 12A may be positioned over the self-supporting conductive leads 14A such that conductive elements 16A (FIG. 1), disposed on a surface thereof, are aligned with and adjacent the first ends 22A of the conductive elements 16A, and the first ends 22A of the conductive elements 16A may be structurally and electrically coupled to the conductive elements 16A using a conductive material 28, as previously described. Referring to FIG. 11, the carrier strip 206A may be severed from the self-supporting conductive leads 14A. After severing the carrier strip 206A from the self-supporting conductive leads 14A, the self-supporting conductive leads 14A may extend laterally from the semiconductor device 12A, and the second ends 24A of the self-supporting conductive leads 14A may be disposed laterally outward from the semiconductor device 12A and coplanar with the first ends 22A of the self-supporting conductive leads 14A.

Figure 12:
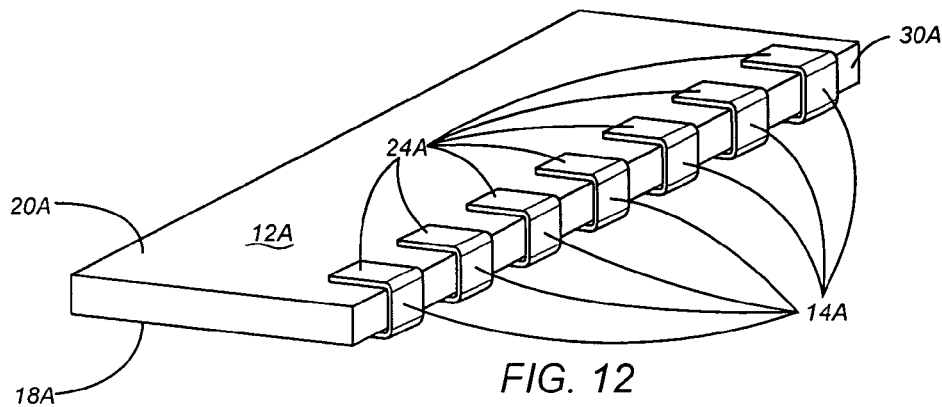

As shown in FIG. 12, the self-supporting conductive leads 14A may be bent or wrapped around side 30A of the semiconductor device 12A, such that the second ends 24A extend generally over the second major surface 20A of the first semiconductor device 12A. By way of example and not limitation, each of the self-supporting conductive leads 14A may be bent or wrapped around the side 30A of the semiconductor device 12A using commercially available trim-and-form equipment for bending or forming self-supporting conductive leads 14A.

As the self-supporting conductive leads 14A are bent or wrapped around the side 30A of the semiconductor device 12A, the second ends 24A of the self-supporting conductive leads 14A may be positioned at relative positions substantially corresponding to a pattern of conductive elements on a second semiconductor device 12B to be attached thereto, as described in further detail below.

In some embodiments, the self-supporting conductive leads 14A may be caused to substantially conform to the exterior surfaces of the semiconductor device 12A. In additional embodiments, the self-supporting conductive leads 14A may not substantially conform to the exterior surfaces of the semiconductor device 12A.

Figure 13:
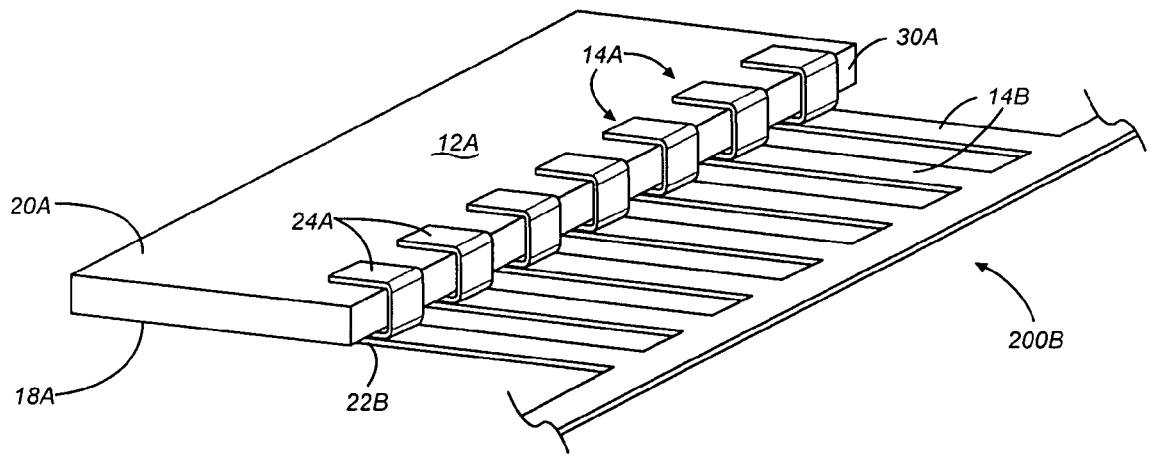

Referring to FIG. 13, a second lead frame 200B may be provided that is generally similar to the first lead frame 200A (FIGS. 8-10), with the exception that the self-supporting conductive leads 14B of the second lead frame 200B may be longer than the self-supporting conductive leads 14A of the first lead frame 200A. As shown in FIG. 13, the first ends 22B of the second self-supporting conductive leads 14B may be aligned with and positioned over the first ends 22A of the self-supporting conductive leads 14A, and the first ends 22B of the self-supporting conductive leads 14B may be structurally and electrically coupled to the first ends 22A of the self-supporting conductive leads 14A, as previously described.

Figure 14:
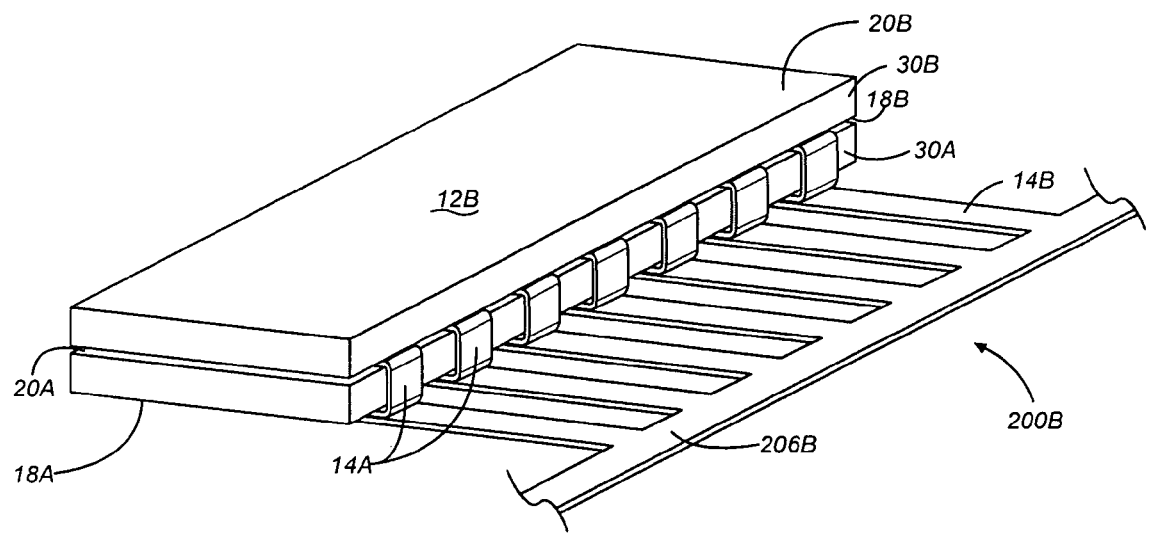

As shown in FIG. 14, a second semiconductor device 12B may be positioned over the second ends 24A (FIG. 13) of the first self-supporting conductive leads 14A such that conductive elements 16B (FIG. 1) disposed on a surface of the second semiconductor device 12B are aligned with and adjacent the second ends 24A of the self-supporting conductive leads 14A. The second ends 24A of the self-supporting conductive leads 14A may be structurally and electrically coupled to the conductive elements 16B of the second semiconductor device 12B using a conductive material 28, as previously described. In additional embodiments, the conductive elements 16B of the second semiconductor device 12B may be attached to the second ends 24A of the self-supporting conductive leads 14A prior to attaching the first ends 22B of the self-supporting conductive leads 14B to the first ends 22A of the self-supporting conductive leads 14A.

Figure 15:
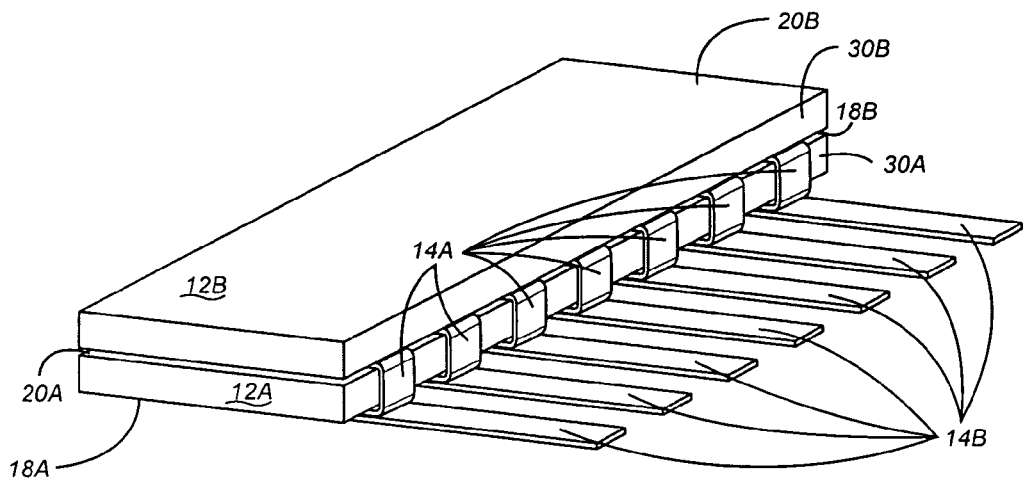

Referring to FIG. 15, the carrier strip 206B may be severed from the self-supporting conductive leads 14B in a manner substantially identical to that previously described in relation to the carrier strip 206A with reference to FIG. 11. After severing the carrier strip 206B from the self-supporting conductive leads 14B, the self-supporting conductive leads 14B may extend laterally from the assembly, and the second ends 24B of the self-supporting conductive leads 14B may be disposed laterally outward from the assembly and coplanar with the first ends 22B of the self-supporting conductive leads 14B.

Figure 16:
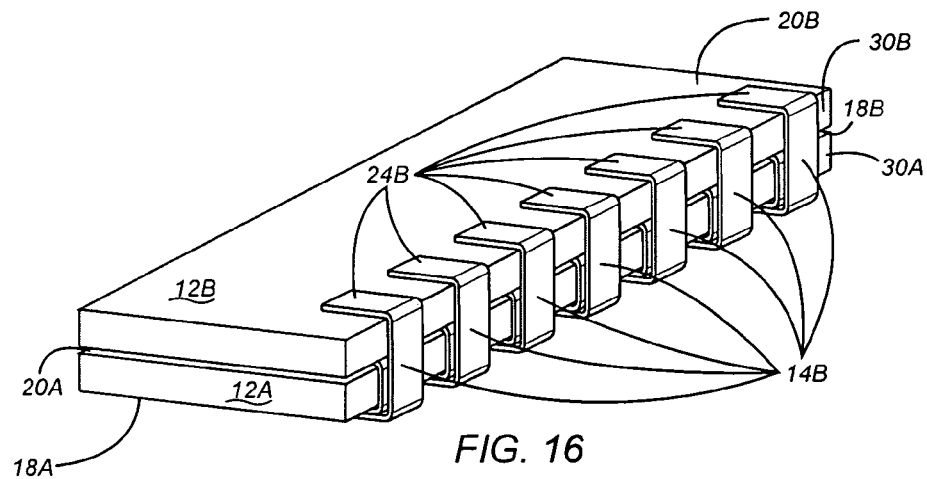

As shown in FIG. 16, the self-supporting conductive leads 14B may be bent or wrapped around the side 30A of the first semiconductor device 12A and the side 30B of the second semiconductor device 12B, such that the second ends 24B extend generally over the second major surface 20B of the second semiconductor device 12B. As the self-supporting conductive leads 14B are bent or wrapped around the side 30A of the first semiconductor device 12A and the side 30B of the second semiconductor device 12B, the second ends 24B of the self-supporting conductive leads 14B may be positioned at relative positions substantially corresponding to a pattern of conductive elements on a third semiconductor device 12C (FIG. 1) to be attached thereto.

Figure 17:
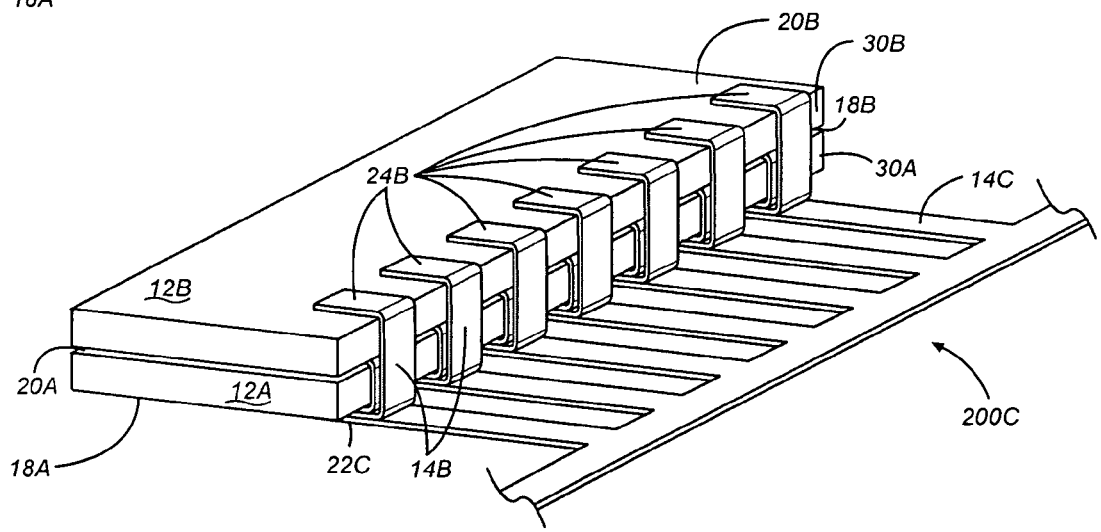

Referring to FIG. 17, a third lead frame 200C may be provided that is generally similar to the first lead frame 200A and the second lead frame 200B, with the exception that the self-supporting conductive leads 14C of the third lead frame 200C may be longer than the self-supporting conductive leads 14B of the second lead frame 200B. As shown in FIG. 17, the first ends 22C of the third self-supporting conductive leads 14C may be aligned with and positioned over the first ends 22B of the self-supporting conductive leads 14B, and the first ends 22C of the self-supporting conductive leads 14C may be structurally and electrically coupled to the first ends 22B of the self-supporting conductive leads 14B, as previously described.

The above-described processes may be repeated until a selected number of semiconductor devices have been structurally and electrically coupled to one another, to provide a semiconductor device assembly that embodies teachings of the present invention. For example, the above-described processes may be repeated to structurally and electrically couple together four semiconductor devices 12A-12D, thereby providing the semiconductor device assembly 10 shown in FIG. 1. Furthermore, the process described above with reference to FIGS. 8-17 may be used to provide any of the previously described semiconductor device assemblies, simply by flipping the semiconductor devices over as necessary and attaching the conductive elements of each semiconductor devices to the respective ends of the conductive leads that are disposed adjacent thereto.

Figure 18:
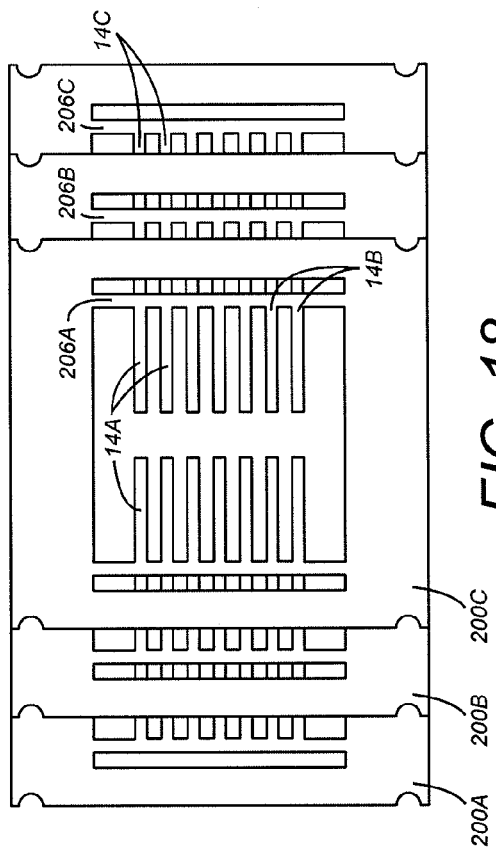
FIGS. 18-21 illustrate another example of a method for forming a semiconductor device assembly that embodies teachings of the present invention.

In additional methods that embody teachings of the present invention, the leads of each lead stack 15 (FIG. 1) may be structurally and electrically coupled to one another prior to attaching any semiconductor device to the conductive leads. For example, the previously described first lead frame 200A, second lead frame 200B, and third lead frame 200C may be provided and stacked one on top of another, such that the first ends 22A, 22B, 22C of the self-supporting conductive leads 14A, 14B, 14C are disposed adjacent one another, as shown in FIG. 18. The first ends 22A, 22B, 22C of the self-supporting conductive leads 14A, 14B, 14C then may be structurally and electrically coupled together by, for example, using a conductive adhesive, a welding process (e.g., a spot welding process), a soldering process, or a brazing process.

Figure 19:
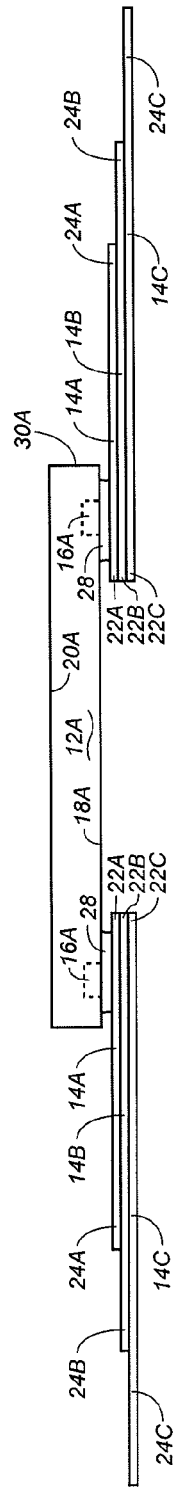
Figure 20:
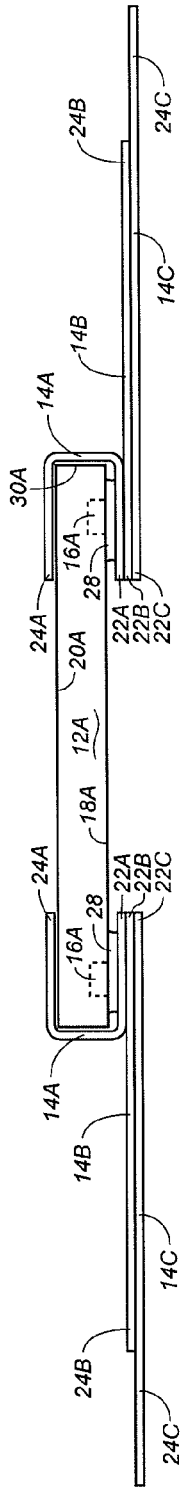

Referring to FIG. 19, a first semiconductor device 12A may be positioned over the self-supporting conductive leads 14A such that conductive elements 16A, disposed on or in a surface thereof, are aligned with and adjacent the first ends 22A of the conductive leads 16A, and the first ends 22A of the self-supporting conductive leads 14A may be structurally and electrically coupled to the conductive elements 16A using a conductive material 28, as previously described. The carrier strip 206A (FIG. 18) may be severed from the self-supporting conductive leads 14A, and the self-supporting conductive leads 14A may be bent or wrapped around the side 30A of the first semiconductor device 12A such that the second ends 24A extend generally over the second major surface 20A of the first semiconductor device 12A, as shown in FIG. 20.

Figure 21:
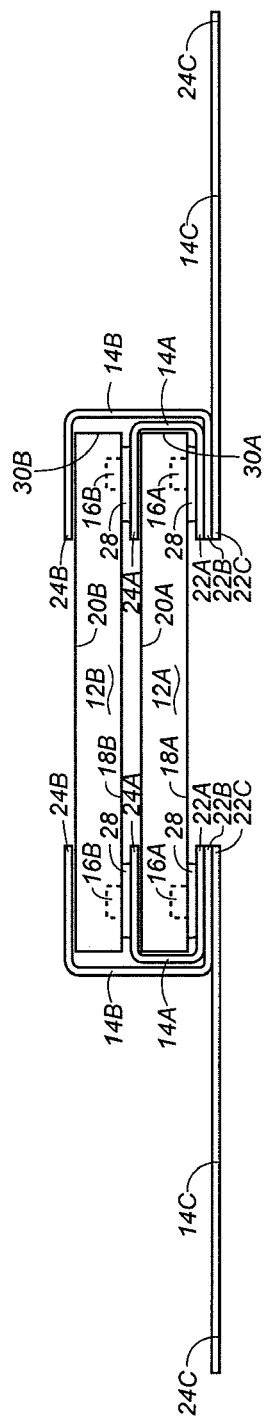

Referring to FIG. 21, a second semiconductor device 12B may be positioned over the second ends 24A (of the first self-supporting conductive leads 14A such that conductive elements 16B disposed on a surface of the second semiconductor device 12B are aligned with and adjacent the second ends 24A of the self-supporting conductive leads 14A. The second ends 24A of the self-supporting conductive leads 14A may be structurally and electrically coupled to the conductive elements 16B of the second semiconductor device 12B using a conductive material 28, as previously described. The carrier strip 206B (FIG. 18) may be severed from the self-supporting conductive leads 14B, and the self-supporting conductive leads 14B may be bent or wrapped around the side 30A of the first semiconductor device 12A and the side 30B of the second semiconductor device 12B such that the second ends 24B extend generally over the second major surface 20B of the second semiconductor device 12B, as shown in FIG. 21.

The above-described processes may be repeated until a selected number of semiconductor devices have been structurally and electrically coupled to one another, thereby providing a semiconductor device assembly that embodies teachings of the present invention. For example, the above described processes may be repeated to structurally and electrically couple together four semiconductor devices 12A-12D, thereby providing the semiconductor device assembly 10 shown in FIG. 1. Furthermore, the process described above with reference to FIGS. 18-21 may be used to provide any of the previously described semiconductor device assemblies, simply by flipping the semiconductor devices over as necessary and attaching the conductive elements of each semiconductor devices to the respective ends of the conductive leads that are disposed adjacent thereto.

In yet additional methods that embody teachings of the present invention, the semiconductor devices may be structurally coupled to one another and to the conductive leads prior to bending or wrapping the conductive leads around any of the semiconductor devices. For example, referring to FIG. 22, the conductive elements 16D of the fourth semiconductor device 12D may be structurally and electrically coupled to the first ends 22D of a fourth plurality of self-supporting conductive leads 14D using a conductive material 28. The first ends 22C of the third plurality of self-supporting conductive leads 14C may be structurally coupled to the second major surface 20D of a fourth semiconductor device 12D using, for example, a non-conducting adhesive material (epoxy, double-sided adhesive film, etc.). The conductive elements 16C of the third semiconductor device 12C may be structurally and electrically coupled to the first ends 22C of the third plurality of self-supporting conductive leads 14C using a conductive material 28. The first ends 22B of the second plurality of self-supporting conductive leads 14B may be structurally coupled to the second major surface 20C of the third semiconductor device 12C using, for example, a non-conducting adhesive material. The conductive elements 16B of the second semiconductor device 12B may be structurally and electrically coupled to the first ends 22C of the third plurality of self-supporting conductive leads 14C using a conductive material 28. The first ends 22A of the first plurality of self-supporting conductive leads 14A may be structurally coupled to the second major surface 20B of the second semiconductor device 12B using, for example, a non-conducting adhesive material. The conductive elements 16A of the first semiconductor device 12A may be structurally and electrically coupled to the first ends 22A of the first plurality of self-supporting conductive leads 14A using a conductive material 28.

Figure 22:
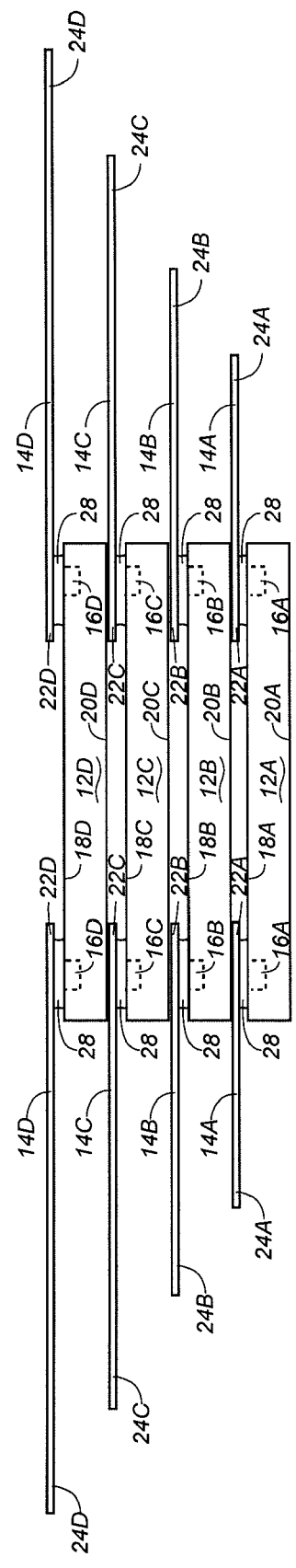
FIG. 22 illustrates yet another example of a method for forming a semiconductor device assembly that embodies teachings of the present invention.

After forming the structure shown in FIG. 22, the first self-supporting conductive leads 14A may be bent or wrapped around the first semiconductor device 12A as previously described, followed by the second plurality of self-supporting conductive leads 14B, the third plurality of self-supporting conductive leads 14C, and the fourth plurality of self-supporting conductive leads 14D. The second ends 24A, 24B, 24C, 24D of the self-supporting conductive leads 14A, 14B, 14C, 14D thus may be positioned generally over the second major surface 20A of the first semiconductor device 12A and structurally and electrically coupled to one another, as previously described, thereby forming the semiconductor device assembly 60 shown in FIG. 2.

The previously described methods have been described with reference to self-supporting conductive leads. Additional methods that embody teachings of the present invention may be carried out using other configurations of electrical pathways, including, for example, conductive traces carried on or in a carrier substrate, as previously described with reference to FIG. 7. In such methods, some ends of the conductive traces may be electrically coupled to conductive elements of semiconductor devices as necessary, while other ends of the conductive traces may be electrically coupled to one another in a manner substantially identical to that previously described with reference to FIG. 7. Furthermore, the carrier substrate (and conductive traces carried thereby) may be bent or wrapped around the sides of the semiconductor devices in a manner substantially similar to that previously described in relation to the self-supporting conductive leads.

Figure 23:
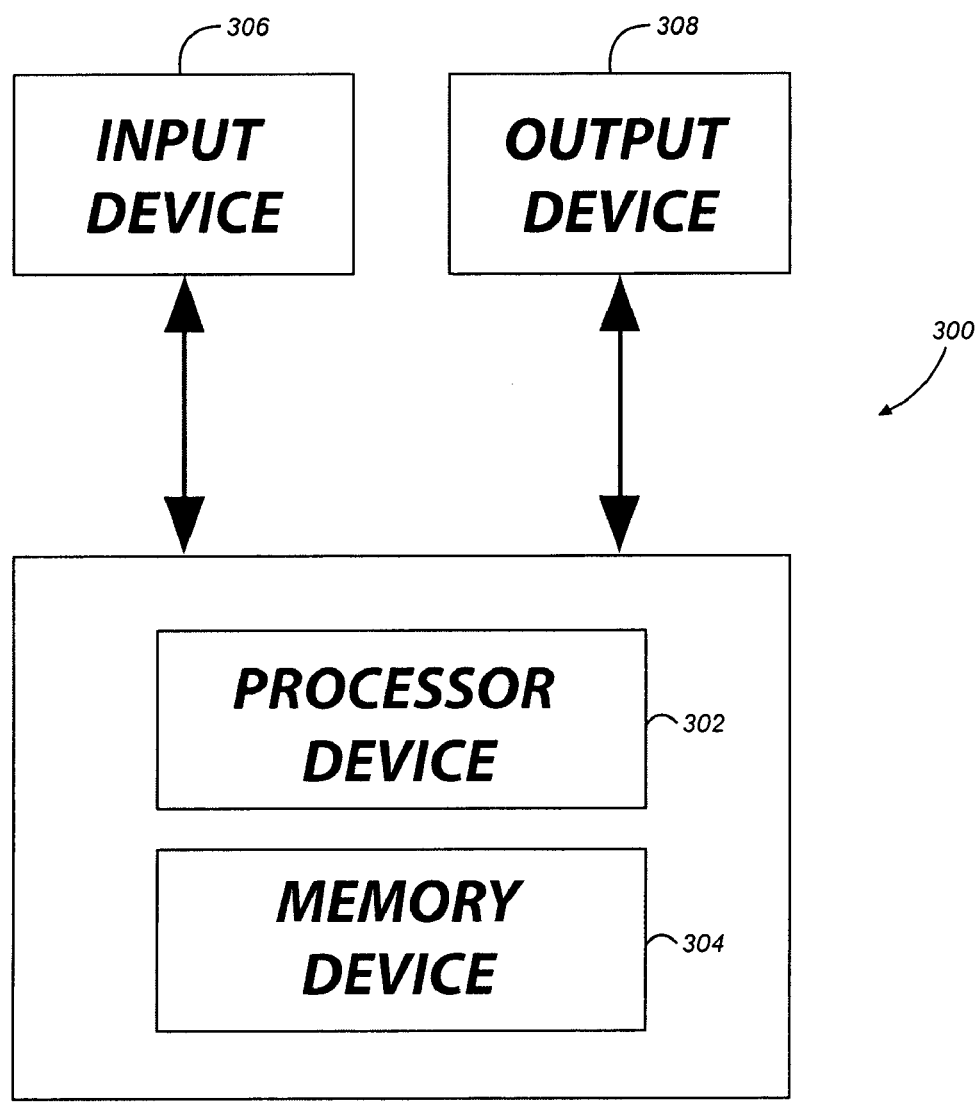
FIG. 23 is a schematic diagram of a system that embodies teachings of the present invention.

Semiconductor device assemblies that embody teachings of the present invention may be used in electronic systems such as, for example, a desktop computer, a laptop computer, a handheld computer (e.g., a personal data assistant (PDA)), a mobile telephone, an audio player, a digital camera, a video player, and a visual display. Furthermore, such electronic systems may include, for example, computer subsystems such as graphic cards, etc. FIG. 23 is a simplified schematic diagram of a computer system 300 that embodies teachings of the present invention and includes a processor device 302 and a memory device 304. At least one of the processor device 302 and the memory device 304 may be or include a semiconductor device assembly that embodies teachings of the present invention (e.g., the semiconductor device assembly 10 shown in FIG. 1, the semiconductor device assembly 60 shown in FIG. 2, the semiconductor device assembly 70 shown in FIG. 3, the semiconductor device assembly 80 shown in FIG. 4, the semiconductor device assembly 100 shown in FIG. 5, and the semiconductor device assembly 150 shown in FIG. 6).

Additionally, the computer system 300 may include an input device 306 (such as, for example, a key pad, a pointing device, or an electronic sensor) and an output device 308 (such as, for example, a monitor, an audio speaker, a printer, or an electromechanical actuator).

Semiconductor device assemblies that embody teachings of the present invention may provide a robust POP structure with enhanced solder joint reliability, and a lower stacked package profile in comparison to conventional POP structures. Such semiconductor device assemblies may also exhibit improved RLC performance by, for example, providing greater speed with higher signal quality and experiencing or exhibiting reduced parasitic capacitances along the conductive pathways extending between the semiconductor devices of the assemblies because the pathways extend around the sides of the semiconductor devices, instead of through each of the semiconductor devices. Furthermore, the self-supporting conductive leads described herein may behave as a heat sink, drawing heat generated within the semiconductor devices to the outside of the assembly, which may provide enhanced performance and/or longer product life. In addition, each semiconductor device, which may be a semiconductor device package or a bare die, may optionally be burned-in and tested prior to assembly in the stack.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims, which follow.

What is claimed is:

1. A semiconductor device assembly comprising:
   a plurality of semiconductor devices stacked one over another comprising:
   a first semiconductor device comprising a first major surface, an opposing second major surface, and at least one conductive element on or in at least the first major surface thereof; and a second semiconductor device situated at least partially over the first major surface or the second major surface of the first semiconductor device, the second semiconductor device comprising a first major surface, an opposing second major surface, and at least one conductive element on or in at least the first major surface thereof; and at least three discrete self-supporting conductive leads, each comprising a first end and a second end, the first ends of the at least three self-supporting conductive leads being structurally and electrically coupled together and extending over one of the first major surface and the second major surface of the first semiconductor device, each of the at least three self-supporting conductive leads extending around a side of the first semiconductor device, the second ends of the at least three self-supporting conductive leads extending over a major surface of a semiconductor device of the plurality of semiconductor devices, and the second ends of the at least three self-supporting conductive leads being structurally and electrically coupled to a conductive element of a semiconductor device of the plurality of semiconductor devices.

2. The semiconductor device assembly of claim 1, wherein the second end of at least one self-supporting conductive lead of the at least three self-supporting conductive leads is disposed between the first semiconductor device and the second semiconductor device.

3. The semiconductor device assembly of claim 1, wherein the second major surface of the second semiconductor device is adjacent the second major surface of the first semiconductor device, the at least one conductive element of the first semiconductor device being structurally and electrically coupled to the first end of at least one self-supporting conductive lead of the at least three self-supporting conductive leads and the at least one conductive element of the second semiconductor device being structurally and electrically coupled to the second end of the at least one self-supporting conductive lead.

4. The semiconductor device assembly of claim 1, wherein at least one self-supporting conductive lead of the at least three self-supporting conductive leads extends over the first major surface of the first semiconductor device and around a side of the first semiconductor device and a side of the second semiconductor device.

5. The semiconductor device assembly of claim 1, wherein at least one self-supporting conductive lead of the at least three self-supporting conductive leads is structurally and electrically coupled to a substrate.

6. The semiconductor device assembly of claim 1, wherein the at least three self-supporting conductive leads consist essentially of metal or a metal alloy.

7. The semiconductor device assembly of claim 1, wherein the first semiconductor device and the second semiconductor device each comprise a substantially bare semiconductor die.

8. The semiconductor device assembly of claim 1, wherein the first semiconductor device and the second semiconductor device each comprise a semiconductor device package.

9. The semiconductor device assembly of claim 1, further comprising:

at least another semiconductor device situated at least partially over the second semiconductor device, the at least another semiconductor device comprising a first major surface, an opposing second major surface, and at least one conductive element on or in at least the first major surface thereof; and at least another self-supporting conductive lead having a first end structurally and electrically coupled to the first end of the at least three self-supporting conductive leads and a second end structurally and electrically coupled to the at least one conductive element of the at least another semiconductor device.

10. The semiconductor device assembly of claim 1, further comprising a plurality of lead stacks, each lead stack comprising a plurality of self-supporting conductive leads, each conductive lead of the plurality of self-supporting conductive leads having a first end and a second end, the first ends of the plurality of self-supporting conductive leads being structurally and electrically coupled together, the second ends of the plurality of self-supporting conductive leads being structurally and electrically coupled to a conductive element of a semiconductor device.

11. The semiconductor device assembly of claim 2, wherein the first major surface of the second semiconductor device is disposed adjacent the second major surface of the first semiconductor device, the at least one conductive element of the first semiconductor device being structurally and electrically coupled to the first end of the at least one self-supporting conductive lead and the at least one conductive element of the second semiconductor device being structurally and electrically coupled to the second end of the at least one self-supporting conductive lead.

12. The semiconductor device assembly of claim 2, wherein the first major surface of the second semiconductor device is adjacent the first major surface of the first semiconductor device, the at least one conductive element of the first semiconductor device and the at least one conductive element of the second semiconductor device each being structurally and electrically coupled to the second end of the at least one self-supporting conductive lead.

13. The semiconductor device assembly of claim 4, wherein the second major surface of the second semiconductor device is adjacent the first major surface of the first semiconductor device, the at least one conductive element of the first semiconductor device being structurally and electrically coupled to the second end of at least another self-supporting conductive lead of the at least three self-supporting conductive leads and the at least one conductive element of the second semiconductor device being structurally and electrically coupled to the second end of the at least one self-supporting conductive lead.

14. The semiconductor device assembly of claim 5, wherein the substrate comprises one of a motherboard, a daughterboard, an interposer substrate, and a carrier substrate.

15. The semiconductor device assembly of claim 9, wherein the first end of the at the least one self-supporting conductive lead of the at least three self-supporting conductive leads is disposed between the first major surface of the first semiconductor device and the first end of at least another self-supporting conductive lead of the at least three self-supporting conductive leads.

16. The semiconductor device assembly of claim 10, wherein each lead stack of the plurality of lead stacks comprises two, three, or four self-supporting conductive leads.

17. The semiconductor device assembly of claim 16, wherein the semiconductor device assembly includes a total of four semiconductor devices.

18. A semiconductor device assembly comprising:

a first semiconductor device having a first major surface, an opposing second major surface, and at least one conductive element on or in at least one of the first major surface or the second major surface thereof;

at least a second semiconductor device situated at least partially over the first major surface or the second major surface of the first semiconductor device, the second semiconductor device having a first major surface, an opposing second major surface, and at least one conductive element on or in at least one of the first major surface and the second major surface thereof;

a first conductive pathway having a first end disposed over the first major surface of the first semiconductor device and a second end disposed over the second major surface of the first semiconductor device, the first conductive pathway extending around a side of the first semiconductor device, the at least one conductive element of the first semiconductor device being electrically coupled to the first end or the second end of the first conductive pathway;

at least a second conductive pathway communicating electrically with the first conductive pathway and having a first end disposed adjacent the first end of the first conductive pathway and a second end disposed over the first major surface or the second major surface of the second semiconductor device, the second conductive pathway extending around a side of the first semiconductor device and a side of the second semiconductor device, the at least one conductive element of the second semiconductor device being electrically coupled to the first conductive pathway or the second conductive pathway, wherein the first conductive pathway and the second conductive pathway each comprise a conductive trace carried by a carrier substrate and the carrier substrate comprises a flexible dielectric material; and a conductive via extending through the conductive trace and the carrier substrate of the first conductive pathway and the second conductive pathway.

19. The semiconductor device assembly of claim 18, wherein the first end of the first conductive pathway is disposed between the first major surface of the first semiconductor device and the first end of the at least a second conductive pathway.

20. A system comprising at least one electronic signal processor configured to communicate with at least one memory device, wherein at least one of the at least one signal processor and the at least one memory device comprises a semiconductor device assembly comprising:

a plurality of semiconductor devices stacked one over another comprising:

a first semiconductor device comprising a first major surface, an opposing second major surface, and at least one conductive element on or in at least the first major surface thereof; and a second semiconductor device situated at least partially over the first major surface or the second major surface of the first semiconductor device, the second semiconductor device comprising a first major surface, an opposing second major surface, and at least one conductive element on or in at least the first major surface thereof; and at least three self-supporting conductive leads, each comprising a first end and a second end, the first ends of the at least three self-supporting conductive leads being structurally and electrically coupled together and extending over one of the first major surface and the second major surface of the first semiconductor device, each of the at least three self-supporting conductive leads extending around a side of the first semiconductor device, the second ends of the at least three self-supporting conductive leads extending over a major surface of a semiconductor device of the plurality of semiconductor devices, and the second ends of the at least three self-supporting conductive leads being structurally and electrically coupled to a conductive element of a semiconductor device of the plurality of semiconductor devices.

21. The system of claim 20, further comprising at least one input device and at least one output device.

22. The system of claim 20, wherein the system comprises one of a computer system, a computer subsystem, a portable telephone, an audio player, a digital camera, a video player, and a visual display.

* * * * *

UNITED STATES PATENT AND TRADEMARK OFFICE
CERTIFICATE OF CORRECTION

| | | |
|---|---|---|
| PATENT NO. | : 7,888,185 B2 | Page 1 of 1 |
| APPLICATION NO. | : 11/506144 | |
| DATED | : February 15, 2011 | |
| INVENTOR(S) | : David J. Corisis et al. | |

It is certified that error appears in the above-identified patent and that said Letters Patent is hereby corrected as shown below:

In column 18, line 51, in Claim 15, after "at" delete "the".

Signed and Sealed this

Twenty-sixth Day of April, 2011

David J. Kappos
*Director of the United States Patent and Trademark Office*